US012118939B2

(12) United States Patent
Feng et al.

(10) Patent No.: US 12,118,939 B2
(45) Date of Patent: Oct. 15, 2024

(54) PIXEL CIRCUIT AND DRIVING METHOD THEREFOR, ARRAY SUBSTRATE, AND DISPLAY DEVICE

(71) Applicant: BOE Technology Group Co., Ltd., Beijing (CN)

(72) Inventors: Yu Feng, Beijing (CN); Libin Liu, Beijing (CN); Tian Dong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/273,695

(22) PCT Filed: Jul. 11, 2022

(86) PCT No.: PCT/CN2022/104828
§ 371 (c)(1),
(2) Date: Jul. 21, 2023

(87) PCT Pub. No.: WO2023/005648
PCT Pub. Date: Feb. 2, 2023

(65) Prior Publication Data
US 2024/0087514 A1 Mar. 14, 2024

(30) Foreign Application Priority Data

Jul. 30, 2021 (WO) ................ PCT/CN2021/109890
Aug. 5, 2021 (CN) .......................... 202110898678.6

(51) Int. Cl.
G09G 3/3233 (2016.01)
G09G 3/3225 (2016.01)
(Continued)

(52) U.S. Cl.
CPC ......... *G09G 3/3233* (2013.01); *G09G 3/3225* (2013.01); *G09G 3/3266* (2013.01);
(Continued)

(58) Field of Classification Search
CPC ......... G09G 3/3225; G09G 2300/0426; G09G 2300/0852; G09G 2310/061
See application file for complete search history.

(56) References Cited

U.S. PATENT DOCUMENTS 10,388,239 B2   8/2019   Lin et al.
11,049,458 B1   6/2021   Fan et al.
(Continued)

FOREIGN PATENT DOCUMENTS

CN   102467876 A   5/2012
CN   103778889 A   5/2014
(Continued)

Primary Examiner — Kevin M Nguyen
(74) Attorney, Agent, or Firm — Banner & Witcoff, Ltd.

(57) ABSTRACT

A pixel circuit and a driving method therefor, an array substrate and a display device are provided. The pixel circuit includes a driving circuit, a data writing circuit, a first initialization circuit. The driving circuit is configured to control a driving current; the data writing circuit is configured to write a data signal into the control terminal of the driving circuit; the first initialization circuit is configured to apply a first initialization voltage to the control terminal of the driving circuit, and includes a first transistor; the data writing circuit includes a second transistor and the driving circuit includes a third transistor; semiconductor materials of active layers of both the first transistor and the second transistor have a smaller leakage current characteristic than a semiconductor material of a third active layer of the third transistor.

20 Claims, 13 Drawing Sheets

(51) Int. Cl.
  *G09G 3/3266* (2016.01)
  *G09G 3/3275* (2016.01)
  *G09G 3/3291* (2016.01)
  *H10K 59/121* (2023.01)

(52) U.S. Cl.
  CPC ......... *G09G 3/3275* (2013.01); *G09G 3/3291* (2013.01); *H10K 59/1213* (2023.02); *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0251* (2013.01); *G09G 2310/061* (2013.01); *G09G 2310/08* (2013.01); *G09G 2320/0247* (2013.01); *G09G 2320/045* (2013.01); *G09G 2330/021* (2013.01)

(56) References Cited

U.S. PATENT DOCUMENTS

| | | |
|---|---|---|
| 2009/0289558 A1 | 11/2009 | Oku |
| 2012/0105410 A1 | 5/2012 | Choi et al. |
| 2012/0147060 A1 | 6/2012 | Jeong |
| 2013/0002632 A1 | 1/2013 | Choi |
| 2015/0154906 A1 | 6/2015 | Chung |
| 2017/0124941 A1 | 5/2017 | Na et al. |
| 2018/0006099 A1 | 1/2018 | Ka et al. |
| 2018/0047337 A1 | 2/2018 | Zhu et al. |
| 2018/0130410 A1 | 5/2018 | Gao et al. |
| 2018/0301092 A1 | 10/2018 | Ma |
| 2019/0057646 A1 | 2/2019 | Lin et al. |
| 2019/0058029 A1 | 2/2019 | Woo et al. |
| 2019/0228706 A1 | 7/2019 | Umeda et al. |
| 2020/0118491 A1 | 4/2020 | Chai et al. |
| 2020/0160788 A1 | 5/2020 | Son |
| 2020/0184893 A1 | 6/2020 | Dong |
| 2020/0226978 A1 | 7/2020 | Lin et al. |
| 2020/0273411 A1 | 8/2020 | Gao et al. |
| 2020/0286972 A1 | 9/2020 | Seo et al. |
| 2020/0312223 A1 | 10/2020 | Yuan et al. |
| 2020/0388229 A1 | 12/2020 | Zhang et al. |
| 2020/0410924 A1 | 12/2020 | Xiong et al. |
| 2021/0005137 A1 | 1/2021 | Toyomura |
| 2021/0027696 A1 | 1/2021 | Kim et al. |
| 2021/0118361 A1 | 4/2021 | Li |
| 2021/0125557 A1 | 4/2021 | Na |
| 2021/0134224 A1 | 5/2021 | He et al. |
| 2021/0193049 A1 | 6/2021 | Lin et al. |
| 2021/0287605 A1 | 9/2021 | Wang et al. |
| 2021/0295779 A1 | 9/2021 | Kim et al. |
| 2021/0312860 A1 | 10/2021 | Kim et al. |
| 2021/0383752 A1 | 12/2021 | Yang |
| 2021/0407419 A1 | 12/2021 | Li et al. |
| 2022/0005414 A1 | 1/2022 | Liu et al. |
| 2022/0028338 A1 | 1/2022 | Yang et al. |
| 2022/0139968 A1 | 5/2022 | Li et al. |
| 2022/0157238 A1 | 5/2022 | Wang et al. |
| 2022/0165213 A1 | 5/2022 | Huang et al. |
| 2022/0165984 A1* | 5/2022 | Choi ............... H10K 50/865 |
| 2022/0335891 A1 | 10/2022 | Gao |
| 2023/0035245 A1 | 2/2023 | Lin et al. |

FOREIGN PATENT DOCUMENTS

| | | |
|---|---|---|
| CN | 102568374 B | 9/2015 |
| CN | 105427803 A | 3/2016 |
| CN | 205920745 U | 2/2017 |
| CN | 106910468 A | 6/2017 |
| CN | 107146577 A | 9/2017 |
| CN | 107256695 A | 10/2017 |
| CN | 107274830 A | 10/2017 |
| CN | 107358918 A | 11/2017 |
| CN | 107564468 A | 1/2018 |
| CN | 108133687 A | 6/2018 |
| CN | 108206008 A | 6/2018 |
| CN | 109285500 A | 1/2019 |
| CN | 109427293 A | 3/2019 |
| CN | 109599062 A | 4/2019 |
| CN | 109817165 A | 5/2019 |
| CN | 110021273 A | 7/2019 |
| CN | 110033734 A | 7/2019 |
| CN | 110648629 A | 1/2020 |
| CN | 110660360 A | 1/2020 |
| CN | 111199711 A | 5/2020 |
| CN | 111354307 A | 6/2020 |
| CN | 111354314 A | 6/2020 |
| CN | 111435587 A | 7/2020 |
| CN | 111445854 A | 7/2020 |
| CN | 111489700 A | 8/2020 |
| CN | 111508426 A | 8/2020 |
| CN | 111583866 A | 8/2020 |
| CN | 111710299 A | 9/2020 |
| CN | 111724745 A | 9/2020 |
| CN | 111754922 A | 10/2020 |
| CN | 111754938 A | 10/2020 |
| CN | 111883055 A | 11/2020 |
| CN | 112053661 A | 12/2020 |
| CN | 112086062 A | 12/2020 |
| CN | 112116890 A | 12/2020 |
| CN | 112133253 A | 12/2020 |
| CN | 112309316 A | 2/2021 |
| CN | 112331678 A | 2/2021 |
| CN | 112397029 A | 2/2021 |
| CN | 112397030 A | 2/2021 |
| CN | 112397565 A | 2/2021 |
| CN | 112435630 A | 3/2021 |
| CN | 112599099 A | 4/2021 |
| CN | 112712774 A | 4/2021 |
| CN | 112753065 A | 5/2021 |
| CN | 112767873 A | 5/2021 |
| CN | 112992071 A | 6/2021 |
| CN | 113097247 A | 7/2021 |
| CN | 113140179 A | 7/2021 |
| CN | 113224123 A | 8/2021 |
| CN | 113450717 A | 9/2021 |
| CN | 113838419 A | 12/2021 |
| CN | 114627807 A | 6/2022 |
| CN | 114694586 A | 7/2022 |
| JP | 2007011214 A | 1/2007 |
| JP | 2019128447 A | 8/2019 |
| JP | WO2019163402 A1 | 4/2021 |
| KR | 20090122119 A | 11/2009 |
| KR | 20130007214 A | 1/2013 |
| KR | 20170049778 A | 5/2017 |
| WO | 2020037767 A1 | 2/2020 |

* cited by examiner

PIXEL CIRCUIT AND DRIVING METHOD THEREFOR, ARRAY SUBSTRATE, AND DISPLAY DEVICE

CROSS REFERENCE TO RELATED APPLICATIONS

The present application is a national stage application of International Patent Application No. PCT/CN2022/104828, filed Jul. 11, 2022, which claims priority of PCT International Application No. PCT/CN2021/109890, filed on Jul. 30, 2021 and Chinese Patent Application No. 202110898678.6, filed on Aug. 5, 2021, and the entire content disclosed by the PCT international application and the Chinese Patent Application is incorporated herein by reference as part of the present application.

TECHNICAL FIELD

Embodiments of the present disclosure relate to a pixel circuit and a driving method therefor, an array substrate and a display device.

BACKGROUND

Organic light emitting diode (OLED) display devices have gradually attracted extensive attention from people due to the advantages of a wide viewing angle, a high contrast, rapid response, a higher brightness and a lower driving voltage than those of inorganic light emitting display devices, etc. Because of the above-mentioned characteristics, OLEDs may be applied to devices having display functions such as mobile phones, displays, laptops, digital cameras, and instruments and apparatuses.

Generally, a matrix driving mode is adopted for pixel circuits in the OLED display devices, which is distinguished between active matrix (AM) driving and passive matrix (PM) driving depending on whether a switching component is introduced in each pixel unit. Although being simple in process and low in cost, a PMOLED has the disadvantages of crosstalk, high power consumption and short service life and thus cannot meet the requirement for high-resolution and large-size display. In contrast, an AMOLED has a set of a thin-film transistor and a storage capacitor integrated in a pixel circuit for each pixel, and control on a current flowing through the OLED can be realized by controlling the driving of the thin-film transistor and the storage capacitor, thus allowing the OLED to emit light as needed. Compared with the PMOLED, the AMOLED is low in driving current required, low in power consumption and longer in service life and thus can meet the requirement for high-resolution, multi-gray and large-size display. Moreover, the AMOLED has significant advantages in terms of visual angle, color rendition, power consumption, response time and the like, and is suitable for display devices with a high information content and a high resolution.

SUMMARY

At least one embodiment of the present disclosure provides a pixel circuit, comprising a driving circuit, a data writing circuit, a first light emitting control circuit, a second light emitting control circuit, a first initialization circuit, a second initialization circuit and an energy storage circuit. The driving circuit comprises a control terminal, a first terminal and a second terminal and is configured to control a driving current which flows through the first terminal and the second terminal for driving a light emitting element to emit light; the data writing circuit is configured to write a data signal into the control terminal of the driving circuit under control of a first scanning signal; the first light emitting control circuit is configured to apply a first power voltage from a first power terminal to the first terminal of the driving circuit under control of a first light emitting control signal; the second light emitting control circuit is configured to apply the driving current from the second terminal of the driving circuit to the light emitting element under control of a second light emitting control signal; the first initialization circuit is configured to apply a first initialization voltage to the control terminal of the driving circuit under control of a first reset control signal; the second initialization circuit is configured to apply a second initialization voltage to the second terminal of the driving circuit under control of a second reset control signal; the energy storage circuit is configured to store the data signal written in the control terminal of the driving circuit; wherein the first initialization circuit comprises a first transistor, the data writing circuit comprises a second transistor and the driving circuit comprises a third transistor; a leakage current characteristic of a semiconductor material of a first active layer of the first transistor is less than a leakage current characteristic of a semiconductor material of a third active layer of the third transistor; and a leakage current characteristic of a semiconductor material of a second active layer of the second transistor is less than the leakage current characteristic of the semiconductor material of the third active layer of the third transistor.

For example, in the pixel circuit provided by at least one embodiment of the present disclosure, the semiconductor material of the first active layer of the first transistor is same as the semiconductor material of the second active layer of the second transistor.

For example, in the pixel circuit provided by at least one embodiment of the present disclosure, the semiconductor material of the first active layer of the first transistor is an oxide semiconductor; and the third active layer of the third transistor is made of a polycrystalline silicon semiconductor material.

For example, in the pixel circuit provided by at least one embodiment of the present disclosure, the oxide semiconductor is an indium oxide semiconductor material; and the polycrystalline silicon semiconductor material is a low-temperature polycrystalline silicon semiconductor material.

For example, in the pixel circuit provided by at least one embodiment of the present disclosure, active layers of respective transistors comprised in the first light emitting control circuit, the second light emitting control circuit and the second initialization circuit are made of a same semiconductor material and in a same layer as the third active layer of the third transistor.

For example, in the pixel circuit provided by at least one embodiment of the present disclosure, the energy storage circuit comprises a first capacitor and a second capacitor; the first capacitor is electrically connected between the control terminal of the driving circuit and the first terminal of the driving circuit; the second capacitor is electrically connected between the first terminal of the driving circuit and the first power voltage terminal; and an electrode, electrically connected to the first terminal of the driving circuit, of the first capacitor is electrically connected to an electrode, electrically connected to the first terminal of the driving circuit, of the second capacitor.

For example, in the pixel circuit provided by at least one embodiment of the present disclosure, the reset circuit is configured to couple a change of the first light emitting control signal to the first terminal of the driving circuit.

For example, in the pixel circuit provided by at least one embodiment of the present disclosure, the reset circuit comprises a third capacitor which is electrically connected between a control terminal of the first light emitting control circuit and the first terminal of the driving circuit.

For example, in the pixel circuit provided by at least one embodiment of the present disclosure, the third capacitor comprises a first capacitor electrode and a second capacitor electrode which are opposite to each other and located in different layers, wherein the first capacitor electrode and the third active layer of the third transistor are in an integral structure, or the first capacitor electrode is electrically connected to the third active layer of the third transistor through a via hole; and the second capacitor electrode and the control terminal of the first light emitting control circuit are in an integral structure.

For example, in the pixel circuit provided by at least one embodiment of the present disclosure, the first initialization voltage and the second initialization voltage are different from each other.

At least one embodiment of the present disclosure further provides an array substrate, comprising a plurality of pixel units arranged in an array, and each of the plurality of pixel units comprises the pixel circuit provided by any one embodiment of the present disclosure.

At least one embodiment of the present disclosure further provides a display device, comprising the array substrate provided by any one embodiment of the present disclosure.

At least one embodiment of the present disclosure further provides a driving method of a pixel circuit, the method comprising a first operating time period which comprises a reset phase, a sampling phase, a writing phase and a light emitting phase. At the reset phase, the first initialization circuit is switched on under the control of the first reset control signal, applying the first initialization voltage to the control terminal of the driving circuit, and the second initialization circuit is switched on under the control of the second reset control signal, applying the second initialization voltage to the second terminal of the driving circuit; at the sampling phase, the first light emitting control circuit and the second light emitting control circuit are switched off, and the first initialization circuit is maintained on under the control of the first reset control signal, applying the first initialization voltage to the control terminal of the driving circuit; and the second initialization circuit is maintained on under the control of the second reset control signal, applying the second initialization voltage to the second terminal of the driving circuit; at the writing phase, the first initialization circuit, the second initialization circuit, the first light emitting control circuit and the second light emitting control circuit are switched off, the data writing circuit is caused to write the received data signal into the control terminal of the driving circuit under the control of the first scanning signal, and the data signal is stored in the energy storage circuit through the energy storage circuit; and at the light emitting phase, the first initialization circuit and the second initialization circuit are switched off, and the first light emitting control circuit is switched on under the control of the first light emitting control signal, applying the first power voltage of the first power terminal to the first terminal of the driving circuit, and the second light emitting control circuit is switched on under the control of the second light emitting control signal, applying the driving current from the second terminal of the driving circuit to the light emitting element to drive the light emitting element.

For example, the driving method provided by at least one embodiment of the present disclosure further comprises a second operating time period immediately following the first operating time period in time, the first light emitting control signal, the second light emitting control signal and the second reset control signal have a first frequency, the first reset control signal and the first scanning signal have a second frequency, and the first frequency is greater than the second frequency; and in the second operating time period, the first light emitting control signal, the second light emitting control signal and the second reset control signal enter a different cycle, and the first reset control signal and the first scanning signal are still in a same cycle, compared with the first operating time period.

For example, in the driving method provided by at least one embodiment of the present disclosure, the first frequency is greater than 30 Hz, and the second frequency is 1 Hz to 10 Hz.

For example, in the driving method provided by at least one embodiment of the present disclosure, the first light emitting control circuit is further switched on under the control of the first light emitting control signal, applying the first power voltage of the first power terminal to the first terminal of the driving circuit, and the second light emitting control circuit is further switched on under the control of the second light emitting control signal, applying the second initialization voltage from the second initialization circuit to the light emitting element.

For example, in the driving method provided by at least one embodiment of the present disclosure, in a case where the second initialization circuit applies the second initialization voltage to the light emitting element, the second initialization voltage prevents the light emitting element from being switched on.

BRIEF DESCRIPTION OF THE DRAWINGS

In order to clearly illustrate the technical solutions of the embodiments of the present disclosure, the drawings of the embodiments will be briefly described in the following; it is obvious that the described drawings are only related to some embodiments of the present disclosure and thus are not limitative to the present disclosure.

DETAILED DESCRIPTION

Figure 1:
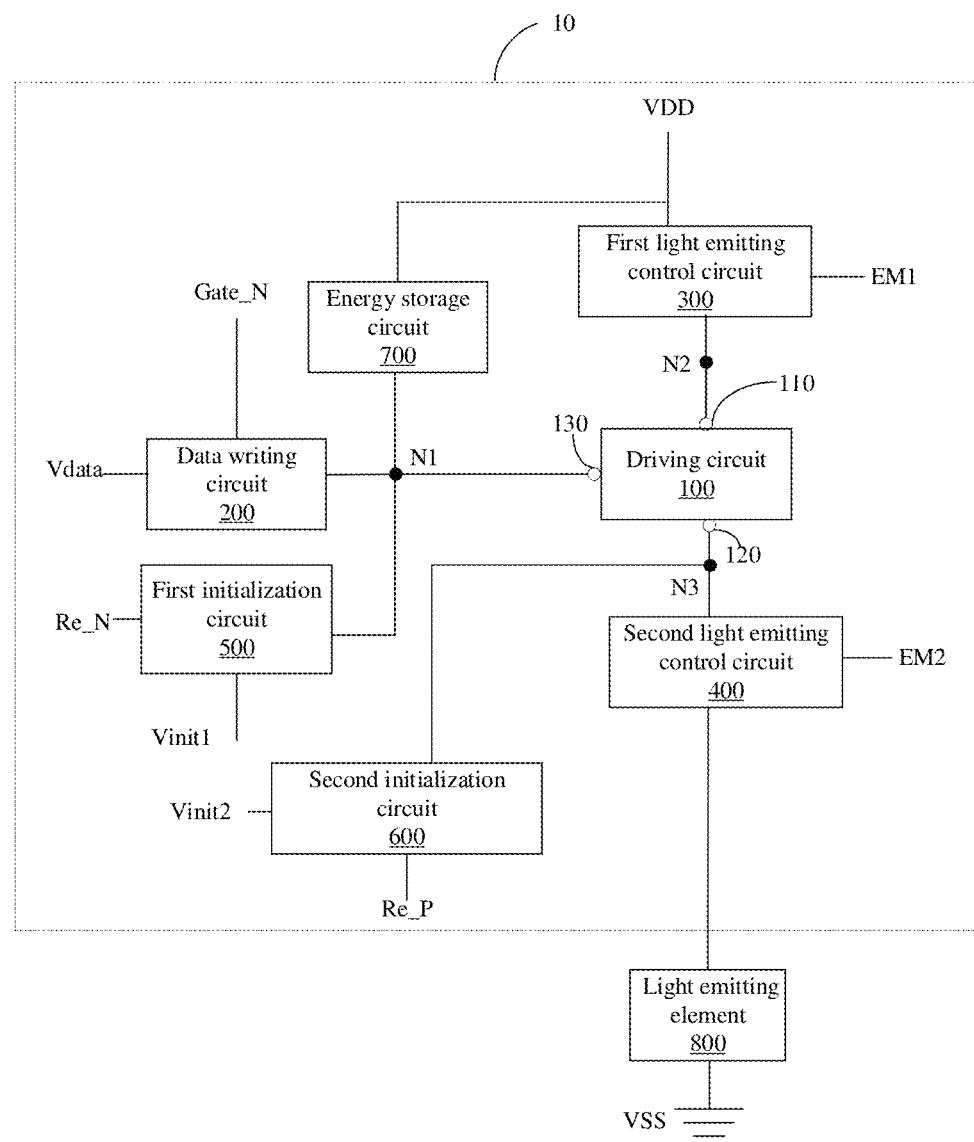
FIG. 1 is a schematic block diagram of a pixel circuit provided by an embodiment of the present disclosure.

The following will clearly and completely describe the technical solutions in the embodiments of this disclosure with reference to the non-limiting example embodiments shown in the drawings and detailed in the following description, and more fully explain the example embodiments of the present disclosure and their various features and advantageous details. It should be noted that the features shown in the figures are not necessarily drawn to scale. The present disclosure omits descriptions of known materials, components, and process techniques so as not to obscure example embodiments of the present disclosure. The examples given are only intended to facilitate understanding of the implementation of the exemplary embodiments of the present disclosure and further enable those skilled in the art to implement the exemplary embodiments. Therefore, these examples should not be understood as limiting the scope of the embodiments of the present disclosure.

Unless otherwise defined, all the technical and scientific terms used herein have the same meanings as commonly understood by one of ordinary skill in the art to which the present disclosure belongs. The terms "first", "second", etc., which are used in the present disclosure, are not intended to indicate any sequence, amount or importance, but distinguish various components. Similarly, similar terms such as "a", "an", or "the", etc., do not indicate the limitation of quantity, but indicate the existence of at least one. The terms "comprise." "comprising," "include," "including." etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On." "under," and the like are only used to indicate relative position relationship, and when the position of the described object is changed, the relative position relationship may be changed accordingly.

The embodiments of the present disclosure will be described in detail below with reference to the accompanying drawings. It should be noted that same reference numerals are used to denote components substantially having the same or similar structures and functions throughout the drawings, and repetitive descriptions about them will be omitted.

An OLED display device typically includes a plurality of pixel units arranged in an array, and each pixel unit can realize a basic function of driving an OLED to emit light through a pixel circuit. A basic pixel circuit used in an AMOLED display device is typically a 2T1C pixel circuit; that is, two thin-film transistors (TFTs) and one storage capacitor (Cs) are utilized to realize the basic function of driving the OLED to emit light. A pixel circuit for the AMOLED is not limited to the pixel circuit described above and may also be a pixel circuit of other structure, such as a 4T1C, 4T2C, 6T1C or 8T2C pixel circuit.

In a display process of some video images, to reduce the power consumption of an OLED, a low-frequency signal may be used to drive a pixel circuit; however, due to the influence of a leakage current of a transistor, phenomena such as flicker may occur when low-frequency driving is adopted. Consequently, the use of the pixel circuit is limited.

At least one embodiment of the present disclosure provides a pixel circuit, including a driving circuit, a data writing circuit, a first light emitting control circuit, a second light emitting control circuit, a first initialization circuit, a second initialization circuit and an energy storage circuit. The driving circuit includes a control terminal, a first terminal and a second terminal and is configured to control a driving current that flows through the first terminal and the second terminal for driving a light emitting element to emit light. The data writing circuit is configured to write a data signal in the control terminal of the driving circuit under the control of a first scanning signal. The first light emitting control circuit is configured to apply a first power voltage of a first power terminal to the first terminal of the driving circuit under the control of a first light emitting control signal. The second light emitting control circuit is configured to apply the driving current from the second terminal of the driving circuit to the light emitting element under the control of a second light emitting control signal. The first initialization circuit is configured to apply a first initialization voltage to the control terminal of the driving circuit under the control of a first reset control signal. The second initialization circuit is configured to apply a second initialization voltage to the second terminal of the driving circuit under the control of a second reset control signal. The energy storage circuit is configured to store the data signal written in the control terminal of the driving circuit. The first initialization circuit includes a first transistor, while the data writing circuit includes a second transistor and the driving circuit includes a third transistor. A leakage current characteristic of a semiconductor material of a first active layer of the first transistor is less than a leakage current characteristic of a semiconductor material of a third active layer of the third transistor; and a leakage current characteristic of a semiconductor material of a second active layer of the second transistor is less than the leakage current characteristic of the semiconductor material of the third active layer of the third transistor.

At least one embodiment of the present disclosure further provides a driving method, an array substrate and a display device corresponding to the pixel circuit described above.

In the pixel circuit provided by at least one embodiment of the present disclosure, the leakage current characteristic of the semiconductor material of the first active layer of the first transistor and the leakage current characteristic of the semiconductor material of the second active layer of the second transistor are each smaller than the leakage current characteristic of the semiconductor material of the third active layer of the third transistor. Therefore, a leakage current in an electric leakage path of the energy storage circuit may be lower, and a voltage retention rate of the control terminal of the driving circuit may be improved. Thus, low-frequency driving can be realized. That is, the pixel circuit can at least partially avoid occurrence of phenomena such as flicker under the low-frequency driving.

The embodiments of the present disclosure are described in detail below with reference to the accompanying drawings. It should be noted that like reference numerals in different drawings will be used to designate like elements described.

One example of an embodiment of the present disclosure provides a pixel circuit 10. The pixel circuit 10 is configured for, e.g., sub-pixels of an OLED display device. As shown in FIG. 1, the pixel circuit 10 includes a driving circuit 100, a data writing circuit 200, a first light emitting control circuit 300, a second light emitting control circuit 400, a first initialization circuit 500, a second initialization circuit 600 and an energy storage circuit 700. The pixel circuit 10 controls, e.g., a light emitting element 800.

For example, the driving circuit 100 includes a control terminal 110, a first terminal 120 and a second terminal 130 and is configured to control a driving current that flows through the first terminal 110 and the second terminal 120 for driving the light emitting element 800 to emit light. For example, the control terminal 130 of the driving circuit 100 is connected to a first node N1, the first terminal 110 of the driving circuit 100 is connected to a second node N2 and the second terminal 120 of the driving circuit 100 is connected to a third node N3. For example, at a light emitting phase, the driving circuit 100 may provide a driving current to the light emitting element 800 to drive the light emitting element 800 to emit light, and the driving current may vary depending on a written data signal (which will be described in detail below), thus allowing for light emission according to a desired "gray level". For example, the light emitting element 800 may be an OLED, a quantum dot LED (QLED) or an inorganic LED. The embodiments of the present disclosure include but are not limited thereto. The light emitting element is configured to have one terminal connected to a second voltage terminal VSS (e.g., providing a low level, e.g., grounded). The embodiments of the present disclosure include but are not limited to this case.

For example, the data writing circuit 200 is configured to write a data signal Vdata into the control terminal 130 of the driving circuit 100 under the control of a first scanning signal Gate_N. For example, the data writing circuit 200 is connected to the control terminal 130 of the driving circuit 100, a first scan line (a first scanning signal terminal Gate_N) and a data line (a data signal terminal Vdata). For example, the first scanning signal from the first scanning signal terminal Gate_N is applied to the data writing circuit 200 to control whether the data writing circuit 200 is turned on. In the event that the data writing circuit 200 is turned on, the data signal Vdata from the data line is written in the control terminal 130 of the driving circuit 100 through the data writing circuit 200.

For example, the first light emitting control circuit 300 is configured to apply a first power voltage VDD of a first power terminal to the first terminal 110 of the driving circuit 100 under the control of a first light emitting control signal EM1. For example, the first light emitting control circuit 300 is connected to the first terminal 110 of the driving circuit 100, the energy storage circuit 700 and the first power terminal VDD. For example, the first light emitting control signal EM1 is applied to the first light emitting control circuit 300 to control whether the first light emitting control circuit 300 is turned on. In the event that the first light emitting control circuit 300 is turned on, the first power voltage VDD of the first power terminal is applied to the first terminal 110 of the driving circuit 100.

For example, at the light emitting phase, the first light emitting control circuit 300 may be turned on in response to the first light emitting control signal EM1 so that the first power voltage VDD may be applied to the first terminal 110 of the driving circuit 100. When the driving circuit 100 is switched on, the driving current flowing through the driving circuit 100 is generated in the pixel circuit. For example, the first power voltage VDD may be a driving voltage, e.g., a high voltage (higher than a second voltage VSS).

For example, the second light emitting control circuit 400 is configured to apply the driving current from the second terminal 120 of the driving circuit 100 to the light emitting element 800 under the control of a second light emitting control signal EM2. For example, the second light emitting control circuit 400 is connected to the second terminal 120 of the driving circuit 100 and the light emitting element 800. For example, the second light emitting control signal EM2 is applied to the second light emitting control circuit 400 to control whether the second light emitting control circuit 400 is turned on. For example, at the light emitting phase, the second light emitting control circuit 400 may be turned on in response to the second light emitting control signal EM2 so that the driving current from the driving circuit 100 may be applied to the light emitting element 800 to provide a driving voltage, thereby driving the light emitting element to emit light.

For example, the first initialization circuit 500 is configured to apply a first initialization voltage Vinit1 to the control terminal 130 of the driving circuit 100 under the control of a first reset control signal Re_N. For example, the first initialization circuit 500 is connected to the first node N1 to be connected to the control terminal 130 of the driving circuit 100, and connected to a first reset control signal line (a first reset control signal terminal Re_N) and a first initialization voltage line (a first initialization voltage terminal Vinit1). For example, at a reset phase, the first initialization circuit 500 may be turned on in response to the first reset control signal Re_N so that the first initialization voltage Vinit1 can be applied to the first node to reset the control terminal of the driving circuit 100, thereby eliminating the influence of a data signal applied to the control terminal of the driving circuit 100, e.g., in a display process of a previous frame in an OLED display panel or display device.

For example, the second initialization circuit 600 is configured to apply a second initialization voltage Vinit2 to the second terminal 120 of the driving circuit 100 under the control of a second reset control signal Re_P. For example, the second initialization circuit 600 is connected to the third node N3 to be connected to the second terminal 120 of the driving circuit 100, and is connected to a second reset control signal line (a second reset control signal terminal Re_P) and a second initialization voltage line (a second initialization voltage terminal Vinit2). For example, at the reset phase, the second initialization circuit 600 may be turned on in response to the second reset control signal Re_P so that the second initialization voltage terminal Vinit2 can be applied to the second node to reset the second terminal 120 of the driving circuit 100.

For example, the energy storage circuit 700 is configured to store the data signal Vdata written in the control terminal 130 of the driving circuit 100. For example, the energy storage circuit 700 is connected to the first node N1 and the first power terminal VDD.

In the pixel circuit 10, the first initialization circuit includes a first transistor, the data writing circuit includes a second transistor and the driving circuit includes a third transistor. A semiconductor material of a first active layer of the first transistor has a smaller leakage current characteristic than a semiconductor material of a third active layer of the third transistor; and a semiconductor material of a second active layer of the second transistor has a smaller leakage current characteristic than the semiconductor material of the third active layer of the third transistor. Since the first transistor included in the first initialization circuit and the second transistor included in the data writing circuit have a smaller leakage current characteristic, a smaller leakage current is induced in a working process so that the data signal stored in the energy storage circuit can be retained for a longer time, rendering the magnitude of the driving current controlled by the driving circuit more stable. Thus, a display panel or display device using the pixel circuit can realize better display quality. Moreover, since the data signal stored in the energy storage circuit is retained for a longer time, a frequency of refreshing the pixel circuit in a display process may be reduced so that the power consumption of a display panel or display device can be reduced.

Alternatively, the leakage current characteristic of the semiconductor materials of the active layers of the first transistor and the second transistor is smaller than the leakage current characteristic of the semiconductor material of the active layer of the third transistor, and also smaller than a leakage current characteristic of a semiconductor material of an active layer of a transistor included in any one of the second initialization circuit, a first light emitting control circuit and a second light emitting control circuit.

Alternatively, in another embodiment, the leakage current characteristic of the semiconductor materials of the active layers of the first transistor and the second transistor is not compared with the leakage current characteristic of the semiconductor material of the active layer of the third transistor (e.g., the two are substantially equal, or the former is greater than the latter), but the leakage current characteristic of the semiconductor materials of the active layers of the first transistor and the second transistor is caused to be smaller than the leakage current characteristic of the semiconductor material of the active layer of the transistor included in any one of the second initialization circuit, the first light emitting control circuit and the second light emitting control circuit.

In the present disclosure, the "leakage current characteristic" refers to a magnitude of a leakage current generated in an active layer of a transistor in the case where involved transistors have a same size (including a width-length ratio of a channel) and are applied with a same voltage (including a gate voltage, a source voltage and a drain voltage).

It needs to be noted that in the description of the embodiments of the present disclosure, the first node N1, the second node N2 and the third node N3 represent junctions of related circuit connections in a circuit diagram rather than actually existing components.

It needs to be noted that in the description of the embodiments of the present disclosure, symbol Vdata may represent either the data signal terminal or a data signal level. Likewise, symbols Vinit1 and Vinit2 may represent either reset voltage terminals or reset voltages; symbol VDD may represent either the first power voltage terminal or the first power voltage; and symbol VSS may represent either the second voltage terminal or the second voltage. They are the same as above in the following embodiments, which will not be described redundantly.

It needs to be noted that the first power voltage terminal VDD in the embodiments of the present disclosure, e.g., remains receiving an input of a direct current (DC) high-level signal which is called the first power voltage; and the second voltage terminal VSS, e.g., remains receiving an input of a DC low-level signal which is called the second voltage and lower than the first power voltage. They are the same as above in the following embodiments, which will not be described redundantly.

For example, in some embodiments of the present disclosure, the semiconductor material of the first active layer of the first transistor is identical to the semiconductor material of the second active layer of the second transistor, and the leakage current characteristic of the semiconductor material is smaller than the leakage current characteristic of the semiconductor material of the third active layer of the third transistor.

In some other embodiments of the present disclosure, the semiconductor material of the first active layer of the first transistor may be different from the semiconductor material of the second active layer of the second transistor, but the leakage current characteristic of the semiconductor material of the first active layer and the leakage current characteristic of the semiconductor material of the second active layer are both smaller than the leakage current characteristic of the semiconductor material of the third active layer.

For example, both of the semiconductor material of the first active layer of the first transistor and the semiconductor material of the second active layer of the second transistor are an oxide semiconductor, and the third active layer of the third transistor is made of a polycrystalline silicon semiconductor material. The leakage current characteristic of the oxide semiconductor is smaller than that of the polycrystalline silicon semiconductor material so that the leakage current in the leakage current path can be reduced, thereby at least partially avoiding flicker.

For example, the oxide semiconductor is an indium oxide semiconductor material, e.g., indium gallium zinc oxide (IGZO) or doped IGZO. The polycrystalline silicon semiconductor material is a low-temperature polycrystalline silicon semiconductor material or a high-temperature polycrystalline silicon semiconductor material. Typically, in a process of crystallizing amorphous silicon to obtain polycrystalline silicon, the polycrystalline silicon obtained at an operating temperature below 600° C. is called low-temperature polycrystalline silicon, otherwise called high-temperature polycrystalline silicon.

In some embodiments of the present disclosure, the pixel circuit 10 may include an N-type transistor and a P-type transistor. For example, the first transistor and the second transistor may be N-type transistors, and the third transistor may be a P-type transistor.

In some embodiments of the present disclosure, the pixel circuit 10 uses only an N-type transistor. Due to a small size of the N-type transistor, the resolution of a display panel or display device may be increased. For example, the first transistor and the second transistor are N-type transistors, and the third transistor is an N-type transistor. However, the semiconductor material (e.g., the oxide semiconductor material) of the active layers of the first transistor and the second transistor is different from the semiconductor material (e.g., the polycrystalline silicon semiconductor material) of the active layer of the third transistor. Compared with other pixel circuits using only N-transistors, in the embodiments of the present disclosure, due to a small leakage current of the N-type transistors corresponding to the first transistor and the second transistor, the flicker phenomenon can be overcome when the pixel circuit is configured for low-frequency driving. On the other hand, due to the small leakage current of the N-type transistors corresponding to the first transistor and the second transistor, the aging problem of the transistors during the use of a display panel or display device is ameliorated.

In some embodiments of the present disclosure, a semiconductor material of active layers of respective transistors included in the first light emitting control circuit, the second light emitting control circuit and the second initialization circuit is identical to and disposed at a same layer with the semiconductor material of the third active layer of the third transistor. For example, the semiconductor material of the active layers of the respective transistors included in the first light emitting control circuit, the second light emitting control circuit and the second initialization circuit and the semiconductor material of the third active layer of the third transistor are both the low-temperature polycrystalline silicon semiconductor material, e.g., an N-type or P-type low-temperature polycrystalline silicon semiconductor material. In these embodiments, the semiconductor material of the active layers of the first transistor and the second transistor is the N-type oxide semiconductor material and disposed at a same layer. Thus, a preparation process of the pixel circuit may be simplified and a manufacturing cost may be reduced.

Figure 2:
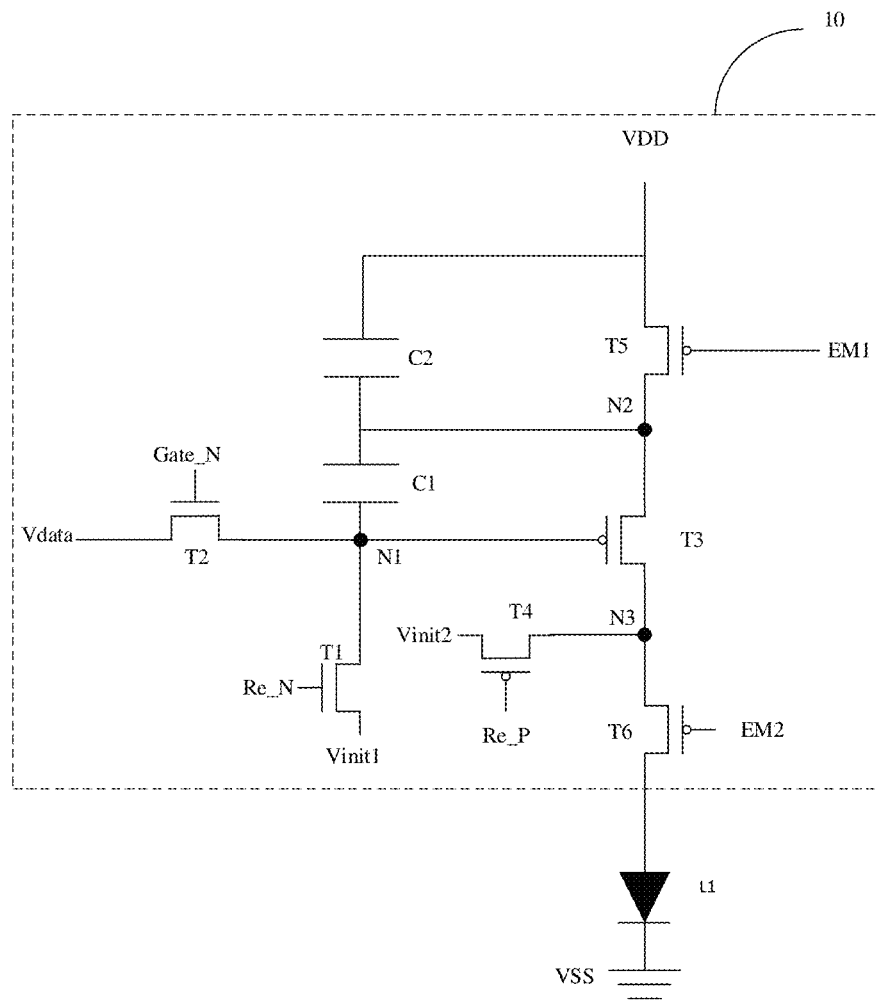
FIG. 2 is a circuit diagram of a specific implementation example of the pixel circuit shown in FIG. 1.

For example, one specific example of the pixel circuit 10 shown in FIG. 1 may be a pixel circuit shown in FIG. 2. As shown in FIG. 2, the pixel circuit 10 includes a first to sixth transistors T1, T2, T3, T4, T5 and T6 as well as a first capacitor C1 and a second capacitor C2.

For example, the third transistor T3 is used as a driving transistor, and the first transistor, the second transistor and the fourth to sixth transistors are used as switching transistors. For example, a light emitting element L1 may be an OLED of any type, such as top-emitting, bottom-emitting and two-side emitting, and is capable of emitting red light, green light, blue light or white light, which will not be limited in the embodiments of the present disclosure.

For example, as shown in FIG. 2, a first reset control circuit 500 may be implemented as the first transistor T1. A gate electrode of the first transistor T1 is connected to the first reset control signal terminal Re_N to receive the first reset control signal Re_N. A first electrode of the first transistor T1 is connected to the first initialization voltage terminal Vinit1 to receive the first initialization voltage Vinit1. A second electrode of the first transistor T1 is connected to the control terminal 130 (the first node N1) of the driving circuit 100. For example, the first transistor T1 is an N-type transistor. For example, the semiconductor material of the first active layer is an oxide semiconductor. For example, the N-type transistor is switched on in response to a high-level signal, which is the same in the following embodiments and will not be described redundantly.

For example, as shown in FIG. 2, the data writing circuit 200 may be implemented as the second transistor T2. A gate electrode of the second transistor T2 is connected to the first scanning signal terminal Gate_N to receive the first scanning signal Gate_N. A first electrode of the second transistor T2 is connected to the data signal terminal Vdata to receive the data signal Vdata. A second electrode of the second transistor T2 is connected to the control terminal 130 (the first node N1) of the driving circuit 100. For example, the second transistor T2 is an N-type transistor. For example, the semiconductor material of the second active layer is an oxide semiconductor.

For example, as shown in FIG. 2, the driving circuit 100 may be implemented as the third transistor T3. A gate electrode of the third transistor T3 acts as the control terminal 130 of the driving circuit 100 and is connected to the first node N1; the first electrode of the first transistor T1 acts as the first terminal 110 of the driving circuit 100 and is connected to the second node N2; and the second electrode of the first transistor T1 acts as the second terminal 120 of the driving circuit 100 and is connected to the third node N3. For example, the third transistor T3 is a P-type transistor. For example, the semiconductor material of the third active layer is a low-temperature polycrystalline silicon semiconductor material. For example, the P-type transistor is switched on in response to a low-level signal, which is the same in the following embodiments and will not be described redundantly.

For example, as shown in FIG. 2, a second reset control circuit 600 may be implemented as the fourth transistor T4. A gate of the fourth transistor T4 is connected to the second reset control signal terminal Re_P to receive the second reset control signal Re_P. A first electrode of the fourth transistor T4 is connected to the second initialization voltage terminal Vinit2 to receive the second initialization voltage Vinit2. A second electrode of the fourth transistor T4 is connected to the second terminal 120 (the third node N3) of the driving circuit 100. For example, the fourth transistor T4 is a P-type transistor. For example, the semiconductor material of the active layer of the fourth transistor T4 is the low-temperature polycrystalline silicon semiconductor material.

For example, as shown in FIG. 2, the first light emitting control circuit 300 may be implemented as the fifth transistor T5. A gate of the fifth transistor T5 is connected to the first light emitting control signal terminal EM1 to receive the first light emitting control signal EM1. A first electrode of the fifth transistor T5 is connected to the first power terminal VDD to receive the first power voltage VDD from the first voltage terminal, and the first electrode of the fifth transistor T5 is connected to the energy storage circuit 700. A second electrode of the fifth transistor T5 is connected to the first terminal 110 (the second node N2) of the driving circuit 100. For example, the fifth transistor T5 is a P-type transistor. For example, the semiconductor material of the active layer of the fifth transistor T5 is the low-temperature polycrystalline silicon semiconductor material.

For example, as shown in FIG. 2, the second light emitting control circuit 400 may be implemented as the sixth transistor T6. A gate of the sixth transistor T6 is connected to the second light emitting control signal terminal EM2 to receive the second light emitting control signal EM2. A first electrode of the sixth transistor T6 is connected to the light emitting element L1. A second electrode of the sixth transistor T6 is connected to the second terminal 120 (the first node N3) of the driving circuit 100. For example, the sixth transistor T6 is a P-type transistor. For example, the semiconductor material of the active layer of the sixth transistor T6 is the low-temperature polycrystalline silicon semiconductor material.

A first terminal (i.e., a positive electrode) of the light emitting element L1 is connected to the first electrode of the sixth transistor T6 and configured to receive a driving current from the second terminal 120 of the driving circuit 100 through the second light emitting control circuit 400, and the second terminal (i.e., a negative electrode) of the light emitting element L1 is configured to be connected to the second voltage terminal VSS to receive the second voltage. For example, the second voltage terminal may be grounded, that is, VSS may be 0 V.

For example, in some embodiments of the present disclosure, the energy storage circuit 700 includes a first capacitor C1 and a second capacitor C2. The first capacitor C1 is electrically connected between the control terminal 130 of the driving circuit 100 and the first terminal 110 of the driving circuit 100; the second capacitor C2 is electrically connected between the first terminal 110 of the driving circuit 100 and the first power voltage terminal VDD; and an electrode, electrically connected to the first terminal 110 of the driving circuit 100, of the first capacitor C1 is electrically connected to an electrode, electrically connected to the first terminal 110 of the driving circuit 100, of the second capacitor C2.

For example, as shown in FIG. 2, the first capacitor C1 is electrically connected between the gate of the third transistor T3 and the first electrode of the third transistor. The second capacitor C2 is electrically connected between the first electrode of the third transistor T3 and the first power voltage terminal VDD, and an electrode, electrically connected to the first electrode of the third transistor T3, of the first capacitor C1 is electrically connected to an electrode, electrically connected to the first electrode of the third transistor T3, of the second capacitor C2. For example, the first capacitor C1 and the second capacitor C2 may share one electrode, and electrodes electrically connected to each other may be formed integrally. A capacitance value of the first capacitor C1 and a capacitance value of the second capacitor C2 are set for a compensation operation, and the capacitance value of the second capacitor C2 is used for adjusting a data range, as described below.

In the display process of some video images, to reduce the power consumption of an OLED, a low-frequency signal may be used to drive a pixel circuit; however, when the pixel circuit is implemented using a transistor having a high leakage current characteristic, due to the influence of a leakage current of the transistor, phenomena such as flicker may occur when low-frequency driving is adopted, the use of the pixel circuit is limited consequently. In the embodiments of the present disclosure, the pixel circuit uses transistors having different leakage current characteristics. For example, the first transistor T1 and the second transistor T2 are transistors having a lower leakage current characteristic than the third transistor. Due to a small leakage current of the first transistor T1 and the second transistor T2 in the leakage current path, the flicker phenomenon may be overcome when the pixel circuit is configured for low-frequency driving.

Alternatively, likewise, the first transistor T1 and the second transistor T2 are transistors having a lower leakage current characteristic than the fourth transistor, the fifth transistor or the sixth transistor.

Alternatively, with no consideration of the leakage current characteristic of the third transistor T3, compared with the fourth transistor, the fifth transistor or the sixth transistor, the first transistor T1 and the second transistor T2 are transistors have a lower leakage current characteristic.

Another aspect of the present disclosure provides a method for driving a pixel circuit. The method includes a first operating time period. The first operating time period includes a reset phase, a sampling phase, a writing phase and a light emitting phase. The first operating time period is described below with reference to FIG. 3.

Figure 3:
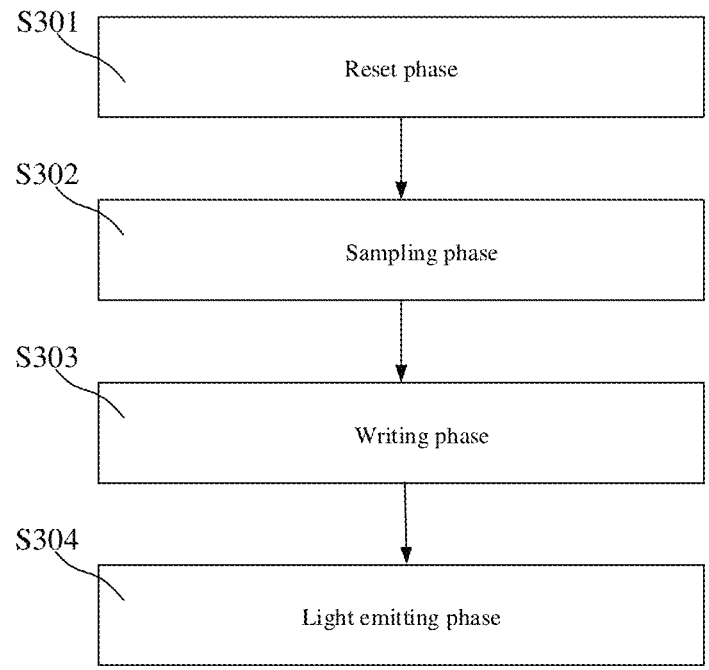
FIG. 3 is a flowchart of a method for driving a pixel circuit provided by an embodiment of the present disclosure.

FIG. 3 is a flowchart of a method for driving a pixel circuit provided by an embodiment of the present disclosure.

As shown in FIG. 3, the method for driving the pixel circuit shown in FIG. 1 or FIG. 2 includes 4 phases: a reset phase 301, a sampling phase 302, a writing phase 303 and a light emitting phase 304.

At the reset phase 301, the first initialization circuit is switched on under the control of the first reset control signal, applying the first initialization voltage to the control terminal of the driving circuit, and the second initialization circuit is switched on under the control of the second reset control signal, applying the second initialization voltage to the second terminal of the driving circuit.

For example, in the pixel circuit 10 shown in FIG. 1, the first initialization circuit 500 is switched on under the control of the first reset control signal Re_N, applying the first initialization voltage Vinit1 to the control terminal 130 of the driving circuit 100, and the second initialization circuit 600 is switched on under the control of the second reset control signal Re_P, applying the second initialization voltage Vinit2 to the second terminal 120 of the driving circuit 100.

For example, in FIG. 2, the first transistor T1 is switched on under the control of the first reset control signal Re_N, applying the first initialization voltage Vinit1 to the gate of the third transistor, and the fourth transistor T4 is switched on under the control of the second reset control signal Re_P, applying the second initialization voltage Vinit2 to the second terminal 120 of the third transistor T3.

In some embodiments of the present disclosure, at the reset phase 301, the first light emitting control circuit 300 may be further switched on under the control of the first light emitting control signal EM1, applying the first power voltage VDD of the first power terminal to the first terminal of the driving circuit 100, and the second light emitting control circuit 400 may be further switched on under the control of the second light emitting control signal EM2, applying the second initialization voltage Vinit2 from the second initialization circuit 600 to the light emitting element.

For example, in FIG. 2, the fifth transistor T5 is switched on under the control of the first light emitting control signal EM1, applying the first power voltage VDD of the first power terminal to the first electrode (i.e., the second node N2) of the third transistor, and the sixth transistor T6 is switched on under the control of the second light emitting control signal EM2, applying the second initialization voltage Vinit2 to the light emitting element L1.

In some embodiments of the present disclosure, in the event that the second initialization circuit 600 applies the second initialization voltage Vinit2 to the light emitting element 800, the second initialization voltage Vinit2 prevents the light emitting element from being switched on. In other words, in the event that the fourth transistor T4 applies the second initialization voltage Vinit2 to the light emitting element L1, a value of the second initialization voltage Vinit2 is, e.g., less than or equal to a value of the second power voltage VSS, whereby the light emitting element L1 has no voltage difference between two terminals thereof or is not biased, thereby avoiding the light emitting element L1 from being switched on to, e.g., emit light at this phase.

In some embodiments of the present disclosure, the first initialization voltage and the second initialization voltage are different from each other. In other word, the first initialization voltage Vinit1 and the second initialization voltage Vinit2 are connected to different voltage terminals and thus may be disposed separately to be different from each other. For example, the second initialization voltage Vinit2 is lower than the first initialization voltage Vinit1. For example, the first initialization voltage Vinit1 may be a DC voltage, and a value of the first initialization voltage Vinit1 may be greater than or equal to −7 V and less than or equal to 0 V. For example, the value of the first initialization voltage Vinit1 may be, but not limited to, −6 V, −5 V, −4 V, −3 V or −2 V.

For example, the second initialization voltage Vinit2 may be a DC voltage, and a value of the second initialization voltage Vinit2 may be greater than or equal to −7 V and less than or equal to 0 V. For example, the value of the second initialization voltage Vinit2 may be, but not limited to, −6 V, −5 V, −4 V, −3 V or −2 V. At the sampling phase 302, the first light emitting control circuit and the second light emitting control circuit are switched off, and the first initialization circuit is caused to remain on under the control of the first reset control signal, applying the first initialization voltage to the control terminal of the driving circuit, and the second initialization circuit is caused to remain on under the control of the second reset control signal, applying the second initialization voltage to the second terminal of the driving circuit. Thus, a threshold voltage of the driving circuit may be written in the second terminal of the driving circuit for the compensation operation of the pixel circuit.

For example, in the pixel circuit 10 shown in FIG. 1, the first light emitting control circuit 300 and the second light emitting control circuit 400 are switched off, and the first initialization circuit 500 is caused to remain on under the control of the first reset control signal Re_N, applying the first initialization voltage Vinit1 to the control terminal 130 of the driving circuit 100, and the second initialization circuit 600 is caused to remain on under the control of the second reset control signal Re_P, applying the second initialization voltage Vinit2 to the second terminal 120 of the driving circuit 100. For example, in FIG. 2, the fifth transistor T5 and the sixth transistor T6 are switched off, while the first transistor T1 remains on under the control of the first reset control signal Re_N, applying the first initialization voltage Vinit1 to the gate electrode of the third transistor T3, and the fourth transistor T4 remains on under the control of the second reset control signal Re_P, applying the second initialization voltage Vinit2 to the second terminal 120 of the third transistor. At this phase, the voltage of the second node N2 (the first terminal of the third transistor T2) may be adjusted to write into a threshold voltage of the third transistor T3 for the compensation operation of the pixel circuit, which will be specifically described below in conjunction with a signal.

At the writing phase 303, the first initialization circuit, the second initialization circuit, the first light emitting control circuit and the second light emitting control circuit are switched off, the data writing circuit is caused to write the received data signal into the control terminal of the driving circuit under the control of the first scanning signal, and the data signal is stored in the energy storage circuit through the energy storage circuit.

For example, in the pixel circuit shown in FIG. 1, the first initialization circuit 500, the second initialization circuit 600, the first light emitting control circuit 300 and the second light emitting control circuit 400 are switched off, the data writing circuit 200 is caused to write the received data signal Vdata in the control terminal 130 of the driving circuit 100 under the control of the first scanning signal Gate_N, and the data signal is stored in the energy storage circuit 700 through the energy storage circuit 700. For example, in FIG. 2, the first transistor T1, the fourth transistor T4, the fifth transistor T5 and the sixth transistor T6 are switched off, and the second transistor is caused to write the received data signal Vdata in the gate of the third transistor 300 under the control of the first scanning signal Gate_N. Meanwhile, the voltage of the second node N2 is adjusted under the action of the third transistor T3 for compensation operation.

At the light emitting phase 304, the first initialization circuit and the second initialization circuit are switched off, and the first light emitting control circuit is switched on under the control of the first light emitting control signal, applying the first power voltage of the first power terminal to the first terminal of the driving circuit, and the second light emitting control circuit is switched on under the control of the second light emitting control signal, applying the driving current from the second terminal of the driving circuit to the light emitting element to drive the light emitting element.

For example, in the pixel circuit shown in FIG. 1, the first initialization circuit 500 and the second initialization circuit 600 are switched off, and the first light emitting control circuit 300 is switched on under the control of the first light emitting control signal EM1, applying the first power voltage VDD of the first voltage terminal to the first terminal 110 of the driving circuit 100, and the second light emitting control circuit 400 is switched on under the control of the second light emitting control signal EM2, applying the driving current from the second terminal 120 of the driving circuit 100 to the light emitting element 800 to drive the light emitting element 800 to emit light.

For example, in FIG. 2, the first transistor T1 and the fourth transistor T4 are switched off, and the fifth transistor T5 is switched on under the control of the first light emitting control signal EM1, applying the first power voltage VDD of the first voltage terminal to the first electrode of the third transistor T3, and the sixth transistor T6 is switched on under the control of the second light emitting control signal EM2, applying the driving current from the second electrode of the third transistor T3 to the light emitting element L1 to drive the light emitting element L1 to emit light.

The method for driving the pixel circuit shown in FIG. 3 is further described below with reference to FIG. 2 and the signal timing diagram shown in FIG. 4A.

Figure 4A:
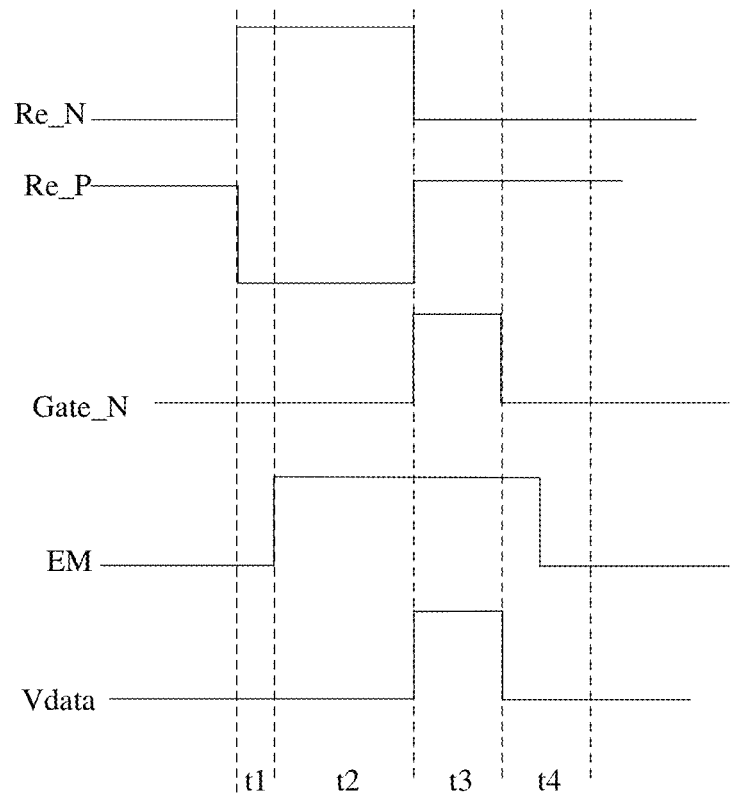
FIG. 4A is a timing diagram of a method for driving a pixel circuit provided by an embodiment of the present disclosure.

As shown in FIG. 4A, the display process of an image of each frame includes four phases: a reset phase t1, a sampling phase t2, a writing phase t3 and a light emitting phase t4. A timing waveform of each signal in each phase is shown in the figure.

At the reset phase t1, the first reset control signal and the second reset control signal are input to turn on the first initialization circuit 500 and a second initialization circuit 600, applying the first initialization voltage Vinit1 to the control terminal 130 of the driving circuit 100 and the second initialization voltage Vinit2 to the second terminal 120 of the driving circuit 100.

As shown in FIG. 2 and FIG. 4A, at the reset t1, since the first transistor T1 is an N-type transistor, the first transistor T1 is switched on by the high level of the first reset control signal Re_N, and the first initialization voltage Vinit1 is written in the first node N1 through the first transistor T1. The fourth transistor T4 is a P-type transistor and is switched on by the low level of the second reset control signal Re_P, and the second initialization voltage Vinit2 is written in the third node N3 through the fourth transistor T4. Meanwhile, the second transistor T2 is an N-type transistor and is switched off by the low level of the first scanning signal Gate_N.

In some embodiments of the present disclosure, the first light emitting control signal EM1 is identical to the second light emitting control signal EM2. As shown in FIG. 4A, the first light emitting control signal EM1 and the second light emitting control signal EM2 are a same light emitting control signal EM.

As shown in FIG. 2 and FIG. 4A, at the reset phase t1, the light emitting control signal EM is at a low level, i.e., the first light emitting control signal EM1 and the second light emitting control signal EM2 are at a low level, and therefore, the fifth transistor T5 and the sixth transistor T6 are switched on. At this point, the voltage of the second node N2 is set as a VDD potential, and the voltage of the first terminal of the light emitting element L1 is set as the second initialization voltage Vinit2.

Therefore, after the reset phase t1, the potential of the first node N1 is the first initialization voltage Vinit1, the potential of the second node N2 is the first power voltage VDD and the potential of the third node N3 and the first terminal of the light emitting element L1 is the second initialization voltage Vinit2.

In some embodiments of the present disclosure, in the event that the fourth transistor T4 applies the second initialization voltage Vinit2 to the light emitting element L1, the second initialization voltage Vinit2 is caused to prevent the light emitting element L1 from being switched on. For example, the second initialization voltage Vinit2 is a lower level compared with the second power voltage VSS such that the light emitting element L1 is avoided from being switched on.

Moreover, a value of the first initialization voltage Vinit1 may be selected such that the third transistor T3 is in an off state with a leakage current, or can be in a state with a weak current.

At the sampling phase t2, the light emitting control signal EM is at a high level, i.e., the first light emitting control signal EM1 and the second light emitting control signal EM2 are at a high level, and therefore, the fifth transistor T5 and the sixth transistor T6 are switched off.

As described above, according to the own characteristics of the third transistor T3, although the first node N1 is at the first initialization voltage Vinit1 and the third transistor T3 has a leakage current or in the state capable of generating a weak current, the potential of the source of the third transistor T3 (i.e., the potential of the second node N2) is discharged to Vinit1−Vth such that the third transistor is switched off, where Vth is the threshold voltage of the third transistor. Accordingly, at this phase, the voltage VGS between the gate (i.e., the first node N1) and the source (i.e., the second node N2) of the third transistor T3 may be caused to satisfy: |VGS|=|Vth|. Thus, the threshold voltage of the third transistor (i.e., the driving transistor) is recorded at the second node N2.

At the writing phase t3, the first transistor T1 is switched off under the action of the low level of the first reset control signal Re_N, and the fourth transistor T4 is switched off under the action of the high level of the second reset control signal Re_P. The second transistor T2 is switched on under the action of the high level of the first scanning signal Gate_N, and at this point, the data signal Vdata is applied to the data line. Thus, the data signal Vdata is written through the second transistor T2 such that the Vdata potential is written into the first node N1. The light emitting control signal EM is at a high level, i.e., the first light emitting control signal EM1 and the second light emitting control signal EM2 are at a high level, and therefore, the fifth transistor T5 and the sixth transistor T6 are switched off. The potential of the second node N2 is changed to $C1/(C1+C2)(Vdata-Vinit1)+Vinit1-Vth$ due to the coupling action of the first capacitor C1 (and the second capacitor C2).

At the light emitting phase t4, the light emitting control signal EM is a low level, i.e., the first light emitting control signal EM1 and the second light emitting control signal EM2 are a low level, and therefore, the fifth transistor T5 and the sixth transistor T6 are switched on. At this point, the potential of the second node N2 returns to the first power voltage VDD, and the pixel circuit generates a driving current which is applied to the light emitting element L1 to drive the light emitting element L1 to emit light. At this phase, the potential of the first node N1 is coupled to $C2/(C1+C2)(Vdata-Vinit1)+Vdd+Vth$. The third transistor T3 is in a saturated state, and therefore, the driving current for driving the light emitting element L1 is calculated according to the following formula: $IOLED=1/2*K*(Vgs-Vth)^2$, where $K=W*COX*U/L$. The following values: $Vg=VN1=C2/(C1+C2)(Vdata-Vinit1)+Vdd+VTH$, $Vs=VN2=Vdd$, and $Vgs=Vg-Vs=C2/(C1+C2)(Vdata-Vinit1)+VTH$, may be substituted into the above formula to derive: $I_{OLED}=1/2*K*(C2/(C1+C2)(Vdata-Vinit1))^2$.

In the above formula, Vth represents the threshold voltage of the third transistor T3, and K is a constant related to the driving transistor itself. As can be seen from the above calculation formula of $I_{OLED}$, the driving current $I_{OLED}$ flowing through the light emitting element L1 is no longer related to the threshold voltage Vth of the third transistor T3. Thus, compensation for the pixel circuit can be realized. The problem of threshold voltage drift of the driving transistor (the third transistor T3 in the embodiments of the present disclosure) due to the manufacturing process and long-time operation is solved, and its influence on the driving current $I_{OLED}$ is eliminated. Accordingly, the display effect of a display device using the same can be improved.

Moreover, as can be seen from the above formula $I_{OLED}=1/2*K*(C2/(C1+C2)(Vdata-Vinit1))^2$, by setting a ratio of C1/C2, the magnitude of a driving current generated by the same Vdata may be set, and a gray level range and a resolution of display of a pixel unit may be set.

As described above, the OLED display panel or display device may operate at different frequencies and may have a high refresh frequency for normal display, and a low refresh frequency may be further selected to save power. For example, in some embodiments of the present disclosure, on the basis of including the first operating time period, the method for driving the pixel circuit described above may further include a second operating time period immediately following the first operating time period in time. The first light emitting control signal EM1, the second light emitting control signal EM2 and the second reset control signal Re_P have a first frequency, and the first reset control signal Re_N and the first scanning signal Gate_N have a second frequency, and the first frequency is greater than the second frequency. Compared with the first operating time period, in the second operating time period, the first light emitting control signal EM1, the second light emitting control signal EM2 and the second reset control signal Re_P enter a different cycle, and the first reset control signal and the first scanning signal are still in a same cycle. In this case, compared with a normal display operation, a display panel or display device using the pixel circuit described above operates at a low refresh frequency.

Figure 4B:
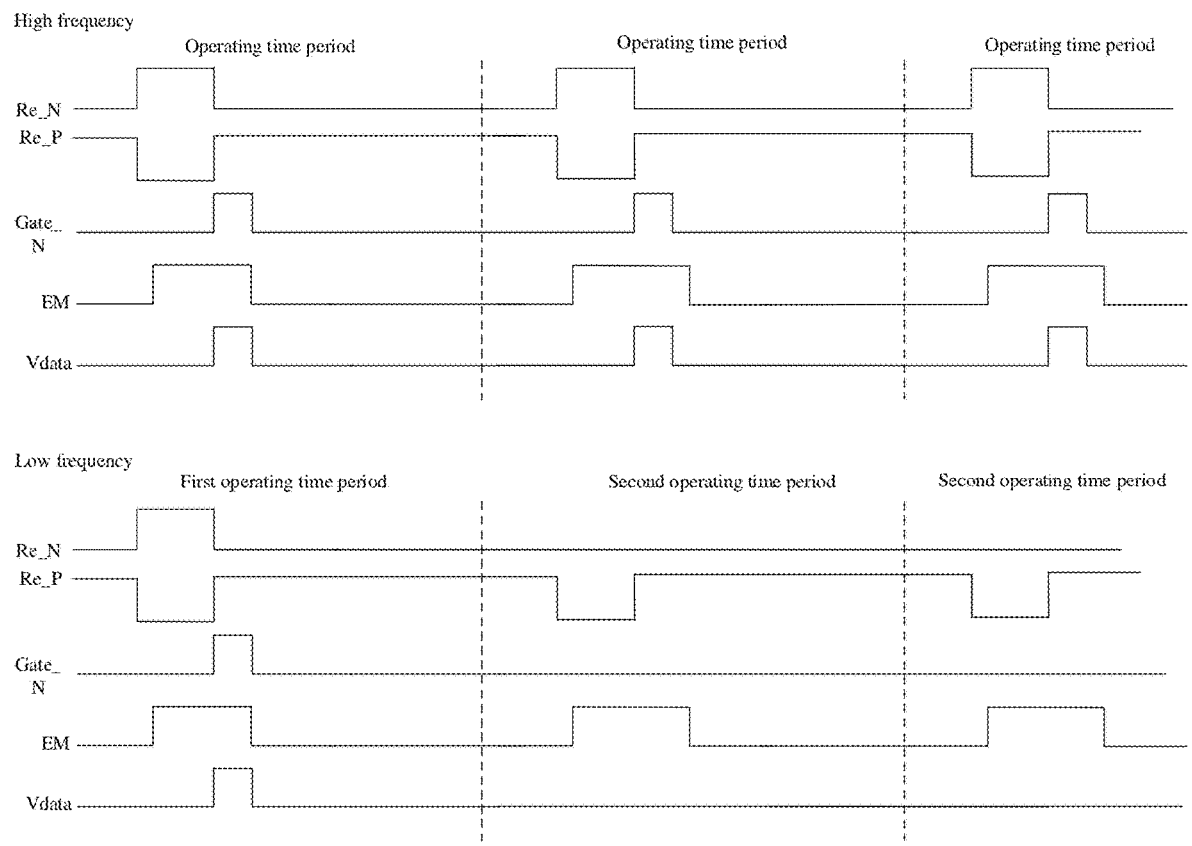
FIG. 4B is a timing comparison diagram of high-frequency driving and low-frequency driving provided by an embodiment of the present disclosure.

FIG. 4B is a timing comparison diagram of high-frequency driving and low-frequency driving provided by an embodiment of the present disclosure.

As shown in FIG. 4B, in some embodiments of the present disclosure, the pixel circuit 10 may be driven in the high-frequency driving mode, as shown by the high-frequency timing diagram in FIG. 4B.

In some other embodiments of the present disclosure, the pixel circuit 10 may be driven in the low-frequency driving mode, as shown by the low-frequency timing diagram in FIG. 4B.

As shown in FIG. 4B, in the high-frequency timing diagram, each driving cycle thereof is the same with FIG. 4A. Therefore, in each cycle (operating time period), the light emitting control signal EM (i.e., the first light emitting control signal EM1 and the second light emitting control signal EM2), the second reset control signal Re_P, the first scanning signal Gate_N and the first reset control signal Re_N correspond to different cycles, respectively, and four phases of reset, sampling, data writing and light emitting will occur in each cycle, which will not be described redundantly.

As shown in FIG. 4B, in the low-frequency timing diagram, on the basis of including the first operating time period, the method for driving the pixel circuit described may further include, e.g., at least one second operating time period immediately following the first operating time period in time. The first operating time period is the same with FIG. 4A, and four phases of reset, sampling, data writing and light emitting occur, which will not be described redundantly. In the second operating time period, the first light emitting control signal EM1, the second light emitting control signal EM2 and the second reset control signal Re_P have a first frequency, and the first reset control signal Re_N and the first scanning signal Gate_N have a second frequency, and the first frequency is greater than the second frequency. For example, the first frequency is greater than 30 Hz, and the second frequency is 1 Hz to 10 Hz. Furthermore, in the second operating time period, the data signal written in the first operating time period will be stored in the energy storage circuit (e.g., the storage capacitor) to be retained, thereby continuously controlling the driving circuit. Thus, when the first light emitting control circuit and the second light emitting control circuit are switched on by the first light emitting control signal EM1 and the second light emitting control signal EM2, respectively, the driving current is still generated in the pixel circuit to drive the light emitting element L1 to emit light.

For example, a duration of the second operating time period is identical to that of the first operating time period. The number of the second operating time periods is not limited to one and may be more than one. For example, at least two second operating time periods are shown in FIG. 4B, and the embodiments of the present disclosure naturally are not limited thereto. The number of the second operating time periods typically depends on a frequency in low-frequency driving. When the frequency is lower compared with a frequency in high-frequency driving, the number of the second operating time periods is greater.

For example, compared with the first operating time period, in the second operating time period, the first light emitting control signal EM1, the second light emitting control signal EM2 and the second reset control signal Re_P enter different cycles, and the first reset control signal and the first scanning signal are still in the same cycle.

Power can be saved by reducing the frequency of the first reset control signal Re_N and the first scanning signal Gate_N, and due to a smaller leakage current characteristic of the first transistor T1 and the second transistor T2, the data signal stored in the energy storage circuit can be retained for a longer time. Therefore, the occurrence of flicker can be reduced while power is saved.

Figure 5:
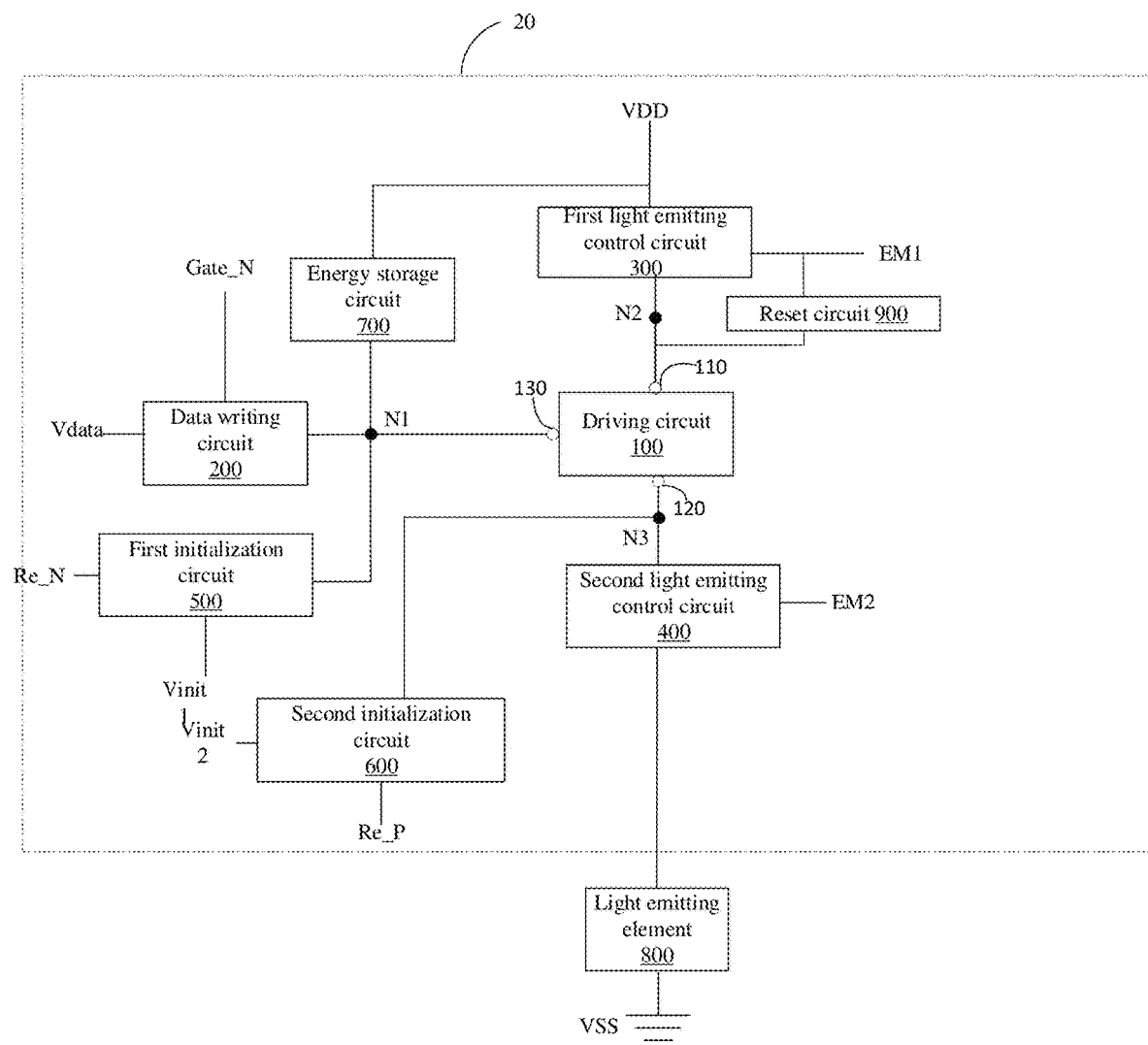
FIG. 5 is a schematic block diagram of another pixel circuit provided by an embodiment of the present disclosure.

FIG. 5 is a schematic block diagram of another pixel circuit provided by an embodiment of the present disclosure.

As shown in FIG. 5, the pixel circuit 20 further includes a reset circuit 900 on the basis of the pixel circuit 10. In the pixel circuit 20, other circuit structure than the reset circuit is the same as the circuit structure in the pixel circuit 10, which will not be described here redundantly.

The reset circuit is configured to write a reset voltage in the first terminal of the driving circuit 100 to provide a bias voltage for the driving transistor in the driving circuit.

Specifically, in an embodiment, the reset circuit 900 is configured to couple a change of the first light emitting control signal EM1 to the first terminal of the driving circuit 100.

In case of a freeze frame of low-frequency driving, the first scanning signal Gate_N causes the data writing circuit 200 to be switched off. The second node N2 may be caused to jump upwards by EM1 through the reset circuit 900, and without the reset phase t1, the second node N2 is enabled to still have a high-frequency reset characteristic to a certain extent so that the occurrence of flicker can be reduced. In other words, high-frequency cyclical adjustment may be performed on the voltage of the second node N2 through the reset circuit 900 so that partial low-frequency components can be changed to high-frequency components, thus reducing the occurrence of flicker.

Figure 6:
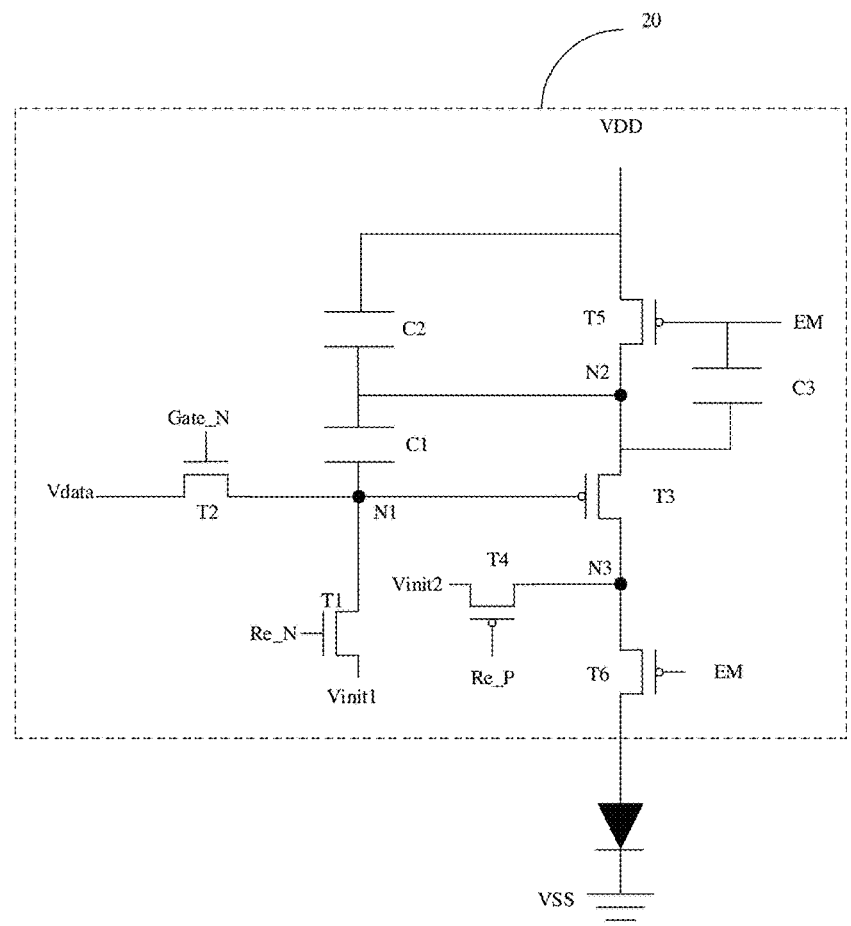
FIG. 6 is a circuit diagram of a specific implementation example of the pixel circuit shown in FIG. 5.

FIG. 6 is a circuit diagram of a specific implementation example of the pixel circuit shown in FIG. 5.

As shown in FIG. 6 and FIG. 5, the reset circuit 900 includes a third capacitor C3 which is electrically connected between a control terminal of the first light emitting control circuit 300 and the first terminal of the driving circuit 100. In other words, the third capacitor C3 is electrically connected between the control terminal of the fifth transistor T5 and the first electrode of the third transistor T3. A capacitance value of the third capacitor C3 is typically set to be much less than the capacitance value of the second capacitor C2, whereby the data signal stored by the second capacitor C2 is substantially not affected. For example, the capacitance value of the third capacitor C3 is one tenth, one hundredth or less of the capacitance value of the second capacitor C2.

In some embodiments of the present disclosure, the third capacitor C3 includes a first capacitor electrode and a second capacitor electrode that are opposite to each other and located at different layers. For example, the first capacitor electrode is disposed integrally with the third active layer of the third transistor T3, or the first capacitor electrode is electrically connected to the third active layer of the third transistor through a via hole. In addition, the second capacitor electrode is disposed integrally with or electrically connected to the control terminal of the first light emitting control circuit 300.

The method for driving the pixel circuit 20 shown in FIG. 5 and FIG. 6 is similar to the method for driving the pixel circuit 10 as described above. For example, the method for driving the pixel circuit 20 includes a first operating time period. The first operating time period includes a reset phase, a sampling phase, a writing phase and a light emitting phase.

The reset phase and the sampling phase are similar to those of the method for driving the pixel circuit 10, which will not be described here redundantly.

At the writing phase t3, the first transistor T1 is switched off under the action of the low level of the first reset control signal Re_N, and the fourth transistor T4 is switched off under the action of the high level of the second reset control signal Re_P. The second transistor T2 is switched on under the action of the high level of the first scanning signal Gate_N, and the Vdata potential is written in the first node N1. The light emitting control signal EM is at a high level, i.e., the first light emitting control signal EM1 and the second light emitting control signal EM2 are at a high level, and therefore, the fifth transistor T5 and the sixth transistor T6 are switched off. Due to the coupling action of C1, the potential of the second node N2 is changed to: C1/(C1+C2+C3)(Vdata−Vinit1)+Vinit1−Vth.

At the light emitting phase t4, the light emitting control signal EM is a low level, i.e., the first light emitting control signal EM1 and the second light emitting control signal EM2 are a low level, and therefore, the fifth transistor T5 and the sixth transistor T6 are switched on. At this time, the second node N2 returns to the VDD potential, and the light emitting element L1 emits light. The potential of the first node N1 is coupled to C2/(C1+C2+C3)(Vdata−Vinit1)+Vdd+Vth. Therefore, the driving current for the light emitting element L1 is calculated according to the following formula: $I_{OLED}=1/2*K*(Vgs-Vth)^2$, where K=W*COX*U/L. The following values: Vg=VN1=C2/(C1+C2+C3)(Vdata−Vinit1)+Vdd+VTH, Vs=VN2=Vdd, and Vgs=Vg−Vs=C2/(C1+C2+C3)(Vdata−Vinit1)+VTH, may be substituted into the above formula to derive: $I_{OLED}=1/2*K*(C2/(C1+C2+C3)(Vdata-Vinit1))^2$.

Likewise, as can be seen from the above calculation formula of $I_{OLED}$, the driving current $I_{OLED}$ flowing through the light emitting element L1 is no longer related to the threshold voltage Vth of the third transistor T3. Thus, compensation for the pixel circuit can be realized. The problem of threshold voltage drift of the driving transistor (the third transistor T3 in the embodiments of the present disclosure) due to the manufacturing process and long-time operation is solved, and its influence on the driving current $I_{OLED}$ is eliminated. Accordingly, the display effect of a display device using the same can be improved.

Moreover, as can be seen from the above formula $I_{OLED}=1/2*K*(C2/(C1+C2+C3)(Vdata-Vinit1))^2$, since the capacitance of the third capacitor C3 is tiny, the magnitude of a driving current generated by the same Vdata may be set by setting a ratio of C1/C2, and a gray level range and a resolution of display of a pixel unit may be set.

A layout and a stacking structure of a plurality of embodiments of the present disclosure will be described with reference to FIG. 7A to FIG. 7N. It needs to be noted that FIG. 7A to FIG. 7N illustrate merely a stacking positional relationship of a first active layer, a first conductive layer, a second conductive layer, a second active layer, a third conductive layer, a first source-drain metal layer and a second source-drain metal layer in an exemplary pixel circuit, and the embodiments of the present disclosure are not limited to the illustrated specific positions, sizes, graphs, etc.

Figure 7A:
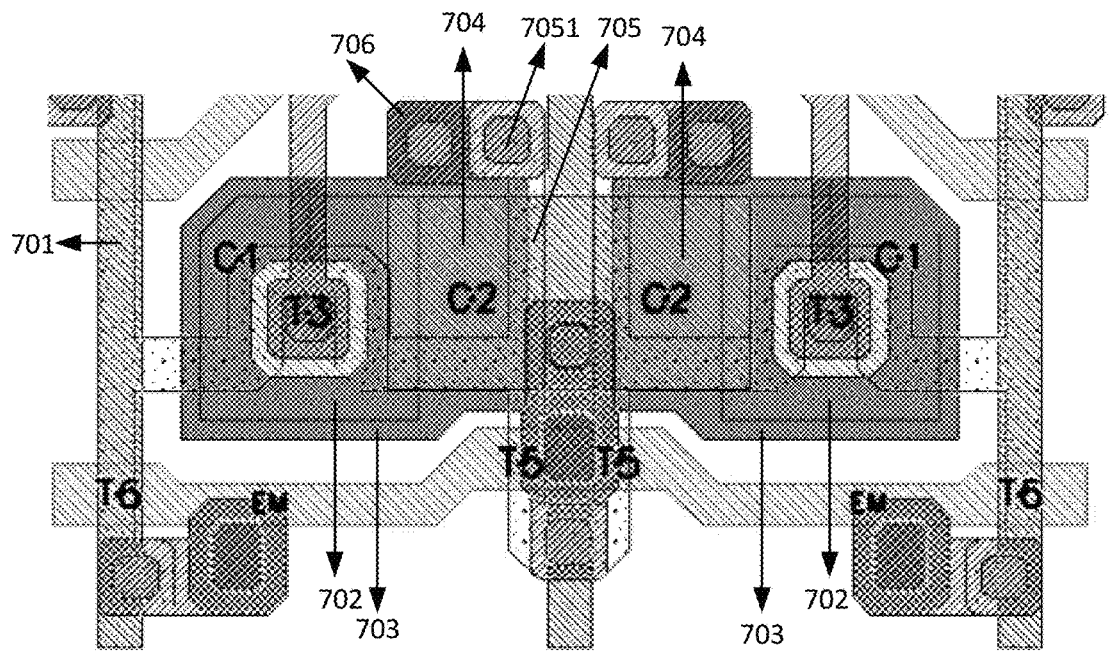
FIG. 7A illustrates an exemplary partial layout of the pixel circuit shown in FIG. 2 provided by an embodiment of the present disclosure.
Figure 7B:
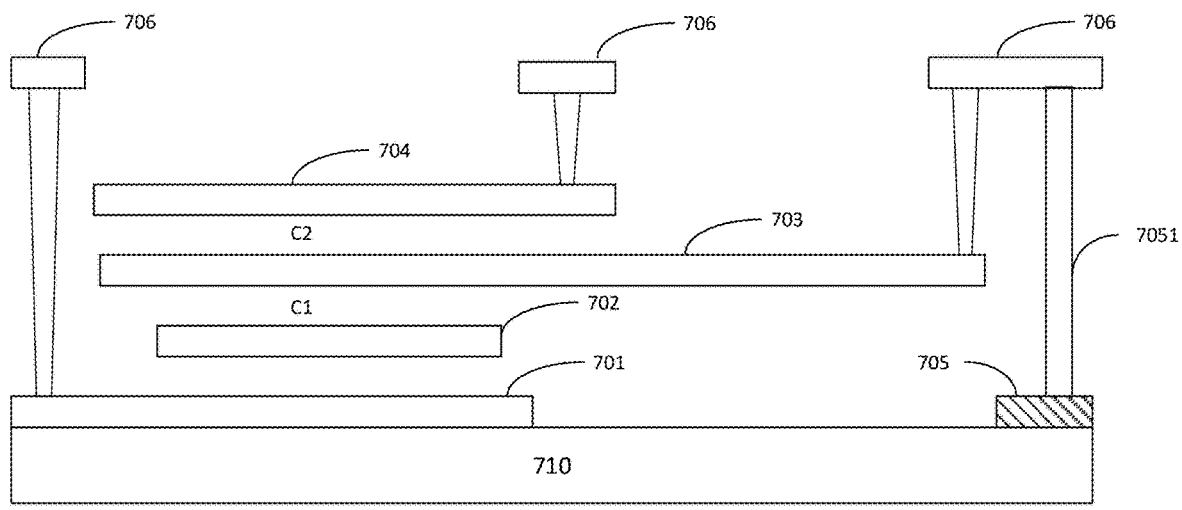
FIG. 7B is a schematic diagram of stacked layers of the pixel circuit shown in FIG. 7A.

FIG. 7A illustrates an exemplary partial layout of the pixel circuit shown in FIG. 2 provided by an embodiment of the present disclosure. FIG. 7B is a schematic diagram of stacked layers of the pixel circuit shown in FIG. 7A.

In at least one embodiment of the present disclosure, a display substrate includes a base substrate 710 and stacked layers formed on the base substrate 710. The stacked layers include a first active layer 701, a first conductive layer 702, a second active layer (not shown), a third conductive layer 704, a first source-drain metal layer 706, a second source-drain metal layer (not shown), etc. These layers are stacked on the base substrate in sequence from the base substrate. For example, in a direction perpendicular to the base substrate, the first active layer is located between the base substrate and the first conductive layer, and the first conductive layer located between the first active layer and the second conductive layer, the second conductive layer located between the first conductive layer and the second active layer, the second active layer located between the second conductive layer and the third conductive layer, the third conductive layer located between the second active layer and the first source-drain metal layer, and the first source-drain metal layer located between the third conductive layer and the second source-drain metal layer which may be configured for electrical connection with a light emitting element, and so on. The schematic diagram of stacked layers shown in FIG. 7B is depicted by taking. e.g., the third transistor T3 for example. That is, the first active layer 701 and the first conductive layer 702 shown in the figure correspond to the active layer and the gate of the transistor, respectively.

In at least one example of this embodiment, the first active layer is, e.g., a low-temperature polycrystalline silicon semiconductor layer for forming, e.g., an active layer of a transistor of the driving circuit in the pixel circuit, and the low-temperature polycrystalline silicon semiconductor layer may also be used for forming, e.g., active layers of a transistor of the first light emitting control circuit, a transistor of the second light emitting control circuit and a transistor of the second initialization circuit in the pixel circuit. According to a type (N-type or P-type) of each transistor, source and drain regions of different portions in the first active layer that correspond to different transistors are doped, or a channel region is doped. Correspondingly, the second active layer is, e.g., an oxide semiconductor layer for forming active layers of a transistor (the first transistor) of the first initialization circuit and a transistor (the second transistor) of the data writing circuit in the pixel circuit.

Figure 7C:
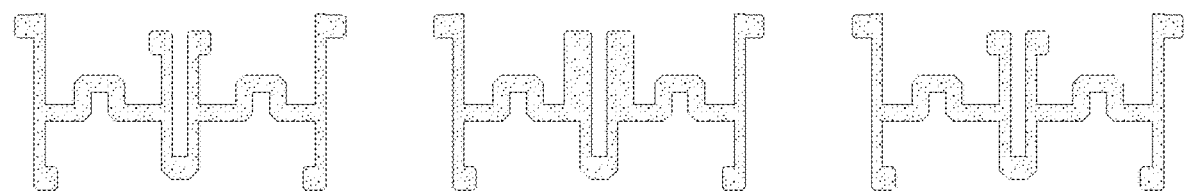
FIG. 7C illustrates a schematic layout of a first active layer in the layout shown in FIG. 7A.

FIG. 7C illustrates a schematic layout of the first active layer 701 in the exemplary partial layout.

As shown in FIG. 7A and FIG. 7C, in the partial layout, the first active layer 701 is in a shape of "H" as a whole for forming respective active layers of the third transistor T3, the fifth transistor T5 and the sixth transistor T6. The active layers of the three transistors are different portions of the first active layer 701, respectively. For example, the portion forming the active layer of the third transistor T3 is approximately in Ω shape. Moreover, when the third transistor T3, the fifth transistor T5 and the sixth transistor T6 are switched on, a conducting path from the first power terminal VDD to the light emitting element needs to be formed. Therefore, other portions than the portions for forming the respective active layers of the third transistor T3, the fifth transistor T5 and the sixth transistor T6 in the first active layer may be doped separately to form a conductor, thus having a lower resistivity and reducing loss. These portions of the first active layer that are formed into a conductor may be referred to as a conductor layer. For example, there is a conductor portion 705 between the third transistor T3 and the fifth transistor T5. As shown in FIG. 7A to FIG. 7G, layouts of pixel circuits of adjacent pixels may be of a mirror image distribution. For example, the layers (the first active layer 701, the first conductive layer 702, the second conductive layer 703, the second active layer, the third conductive layer 704, the first source-drain metal layer 706, the second source-drain metal layer, etc.) in the pixel circuits of adjacent pixels are also of a mirror image distribution.

The first conductive layer 702 is used for forming the gate of the third transistor T3 and the first capacitor electrode of the first capacitor C1. The second conductive layer 703 is used for forming the second capacitor electrode of the first capacitor C1 and the first capacitor electrode of the second capacitor C2. That is, the first capacitor C1 and the second capacitor C2 share one capacitor electrode. The third conductive layer 704 is used for forming the second capacitor electrode of the second capacitor C2. The first capacitor electrode of the second capacitor C2 is formed by the second conductive layer 703, and the second capacitor electrode of the second capacitor C2 is formed by the third conductive layer 704. In addition, the first conductive layer 702 further includes a portion for a light emitting control line EM, and the portion forms both of the gates (not shown in FIG. 7B) of the fifth transistor T5 and the sixth transistor T6. As shown in FIG. 7B, the conductor portion 705 is electrically connected to the first capacitor electrode of the second capacitor C2 through a via hole 7051 and a transition electrode formed in the first source-drain metal layer 706.

Figure 7D:
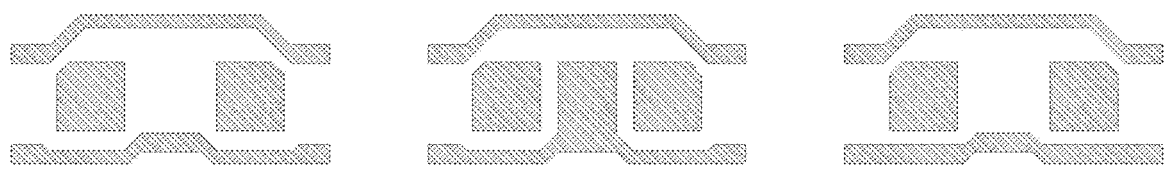
FIG. 7D illustrates a schematic layout of a first conductive layer in the layout shown in FIG. 7A.

A local shape of the first conductive layer 702 in FIG. 7A is, e.g., any shape shown in FIG. 7D. As shown in FIG. 7D, the first conductive layers 702 in pixel circuits of adjacent pixels may be of a mirror image distribution.

Figure 7E:
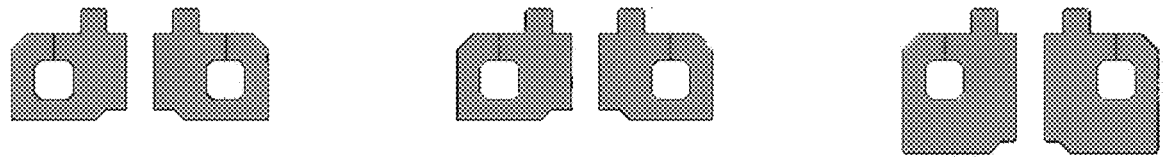
FIG. 7E illustrates a schematic layout of a second conductive layer in the layout shown in FIG. 7A.

A local shape of the second conductive layer 703 for forming the second capacitor electrode of the first capacitor C1 and the first capacitor electrode of the second capacitor C2 in FIG. 7A is as shown in FIG. 7E for example. As shown in FIG. 7E, the second conductive layers 703 in pixel circuits of adjacent pixels may be of a mirror image distribution.

Figure 7F:
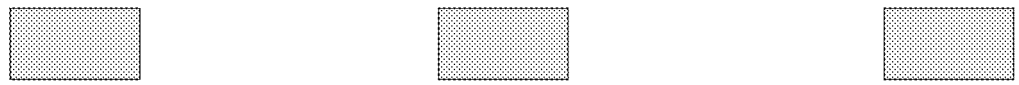
FIG. 7F illustrates a schematic layout of a third conductive layer in the layout shown in FIG. 7A.

A local shape of the third conductive layer 704 for forming the second capacitor electrode of the second capacitor C2 in FIG. 7A is as shown in FIG. 7F for example. As shown in FIG. 7F, the local shape of the third conductive layer 704 for forming the second capacitor electrode of the second capacitor C2 may be similar to a rectangle. For example, the third conductive layers for two adjacent pixels may be formed integrally.

Figure 7G:
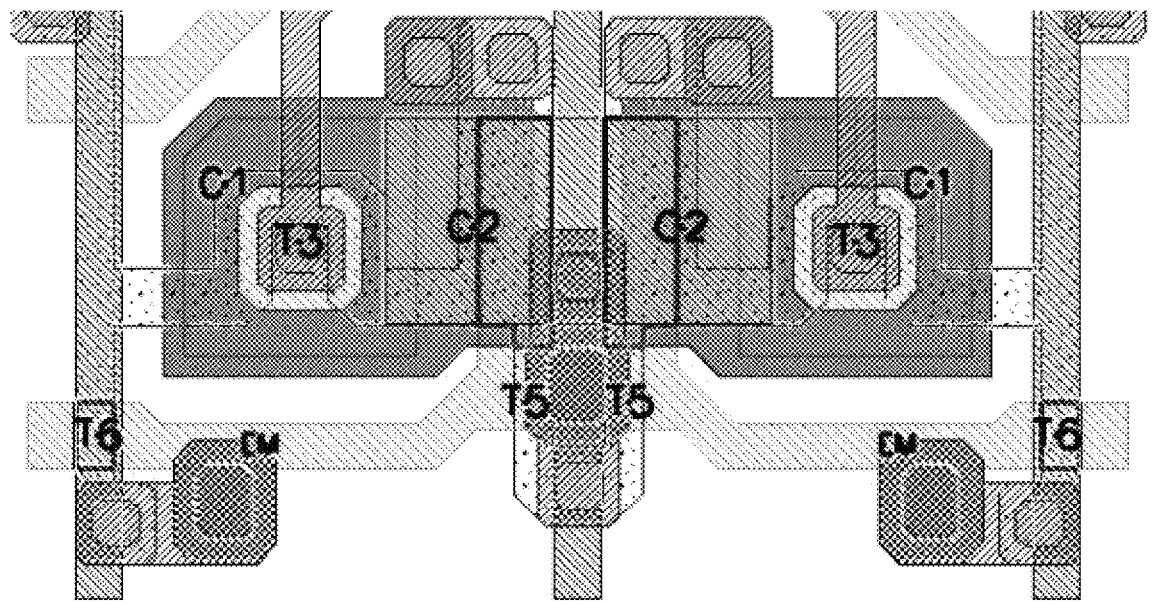
FIG. 7G and FIG. 7H illustrate exemplary partial layouts of a pixel circuit shown in FIG. 6 provided by an embodiment of the present disclosure.
Figure 7H:
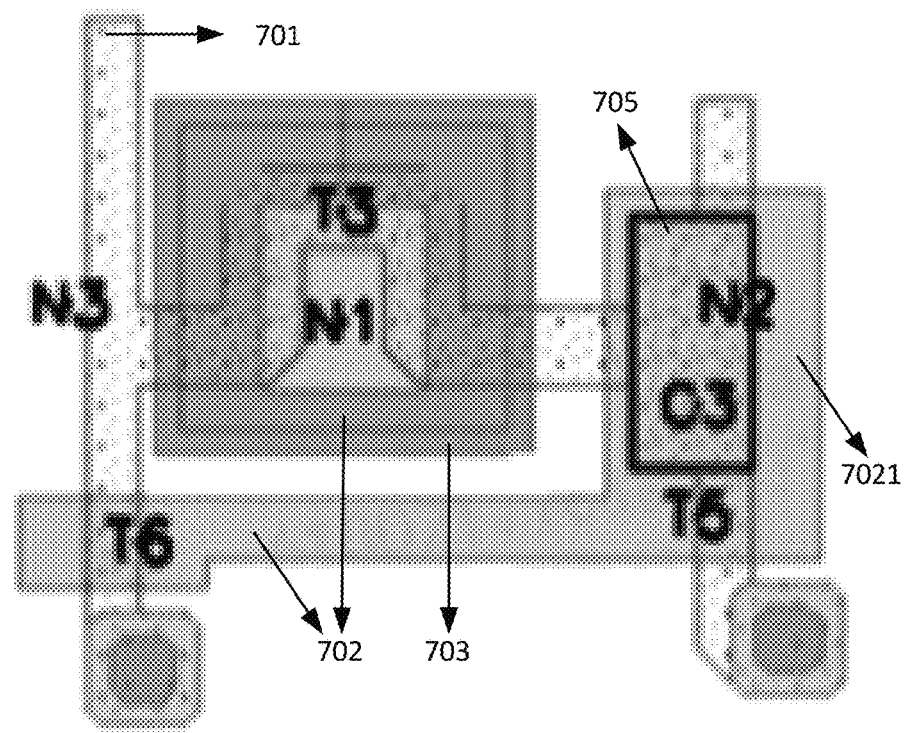
Figure 7I:
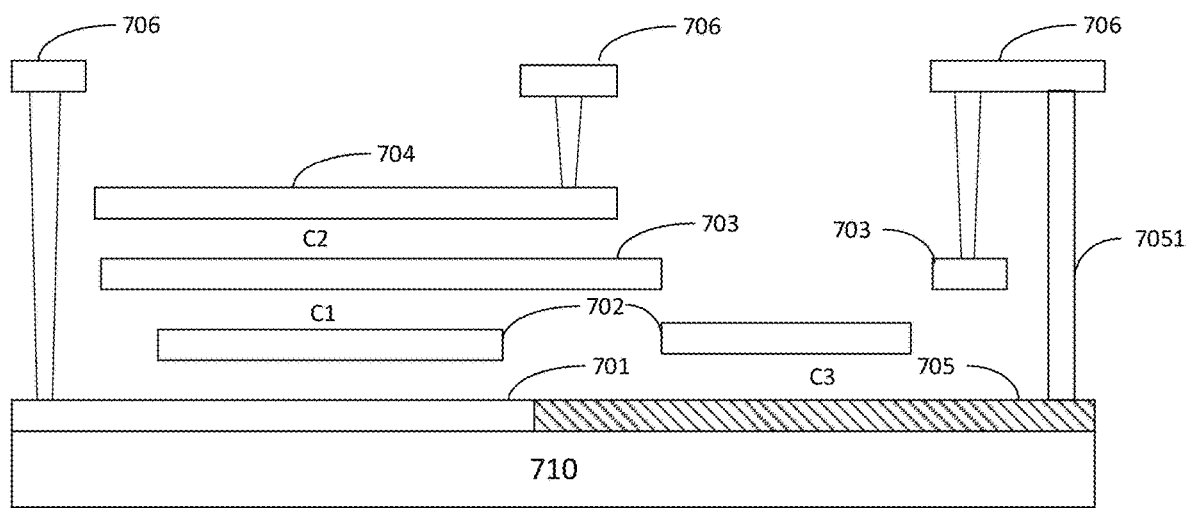
FIG. 7I is a schematic diagram of stacked layers of the pixel circuit shown in FIG. 7H.

FIG. 7G and FIG. 7H illustrate exemplary partial layouts of the pixel circuit shown in FIG. 6 provided by an embodiment of the present disclosure. FIG. 7G illustrates a layout of pixel circuits of two adjacent pixels, and FIG. 7H illustrates an exemplary partial layout of one pixel circuit. The following description is made by taking the exemplary partial layout of one pixel circuit in FIG. 7H for example. FIG. 7I illustrates an exemplary stacking structure of the pixel circuit shown in FIG. 7H; and FIG. 7J illustrates another exemplary stacking structure of the pixel circuit shown in FIG. 7H.

As shown in FIG. 7H, in the exemplary layout, the pixel circuit 20 shown in FIG. 6 includes a third capacitor C3. In FIG. 7G, FIG. 7H, FIG. 7I and FIG. 7J, other portions than the structure for forming the third capacitor C3 are the same with FIG. 7A to FIG. 7F, which will not be described here redundantly. The schematic diagram of stacked layers shown in FIG. 7I and FIG. 7J is depicted by taking, e.g., the third transistor T3 for example. That is, the first active layer 701 and the first conductive layer 702 shown in the figure correspond to the active layer and the gate of the transistor, respectively.

For example, with reference to FIG. 7H and FIG. 7I, the conductor portion 705 electrically connected to the drain of the third transistor directly and the first conductive layer 702 form the third capacitor C3. To form the third capacitor C3, the portion of the first conductive layer 702 for forming the gate of the fifth transistor T5 is modified to form an extension portion 7021. The extension portion 7021 is formed integrally with the gate of the fifth transistor T5 and overlaps the conductor portion 705 in the direction perpendicular to the base substrate.

Figure 7J:
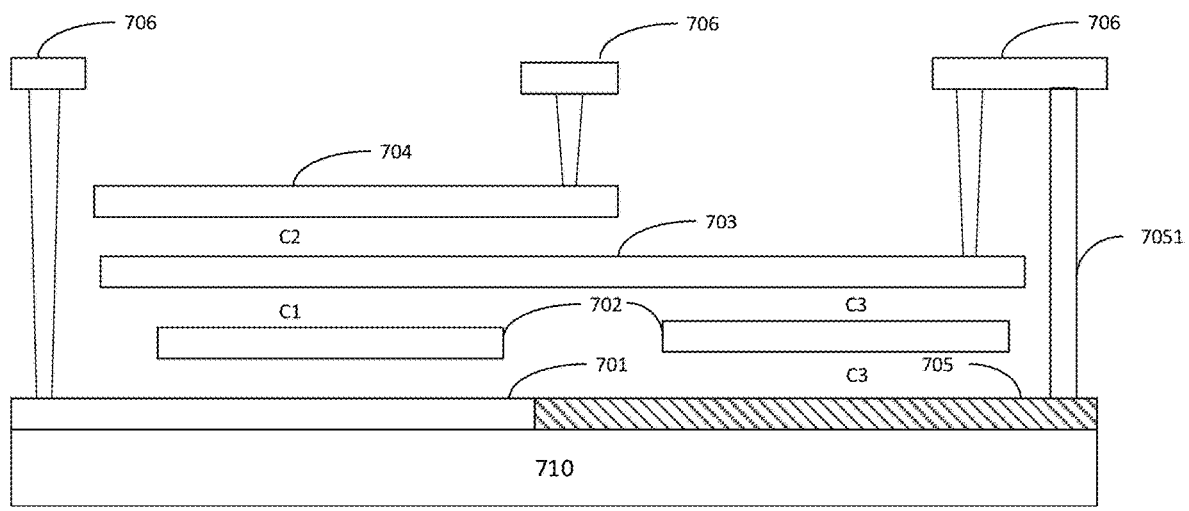
FIG. 7J is a schematic diagram of another stacked layers of the pixel circuit shown in FIG. 7H.

For another example, with reference to FIG. 7H and FIG. 7J, the conductor portion 705 directly electrically connected to the drain electrode of the third transistor, the first conductive layer 702 and the second conductive layer 703 together form the third capacitor C3. To form the third capacitor C3, the portion of the first conductive layer 702 for forming the gate of the fifth transistor T5 is modified to form an extension portion 7021. The extension portion 7021 is formed integrally with the gate electrode of the fifth transistor T5 and overlaps the conductor portion 705 in the direction perpendicular to the base substrate. Moreover, since the portion of the second conductive layer 703 for forming the first capacitor electrode of the second capacitor C2 is electrically connected to the conductor portion 705 through the via hole 7051 and a connection electrode in the first source-drain metal layer 706, and the above-mentioned extension portion 7021 further overlaps the first capacitor electrode of the second capacitor C2 in the direction perpendicular to the base substrate 710, therefore, in this example, the third capacitor C3 includes two portions connected in parallel to each other, namely a first portion formed between the conductor portion 705 and the extension portion and a second portion formed between the extension portion and the first electrode of the second capacitor C2.

Figure 7K:
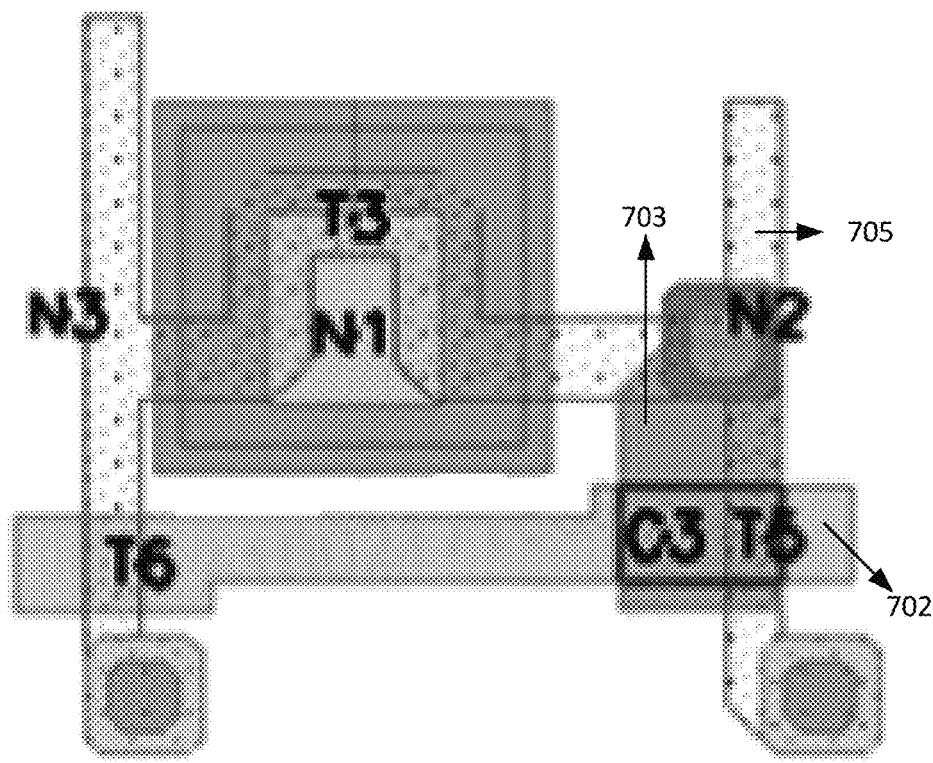
FIG. 7K illustrates another exemplary partial layout of the pixel circuit shown in FIG. 6 provided by an embodiment of the present disclosure.
Figure 7L:
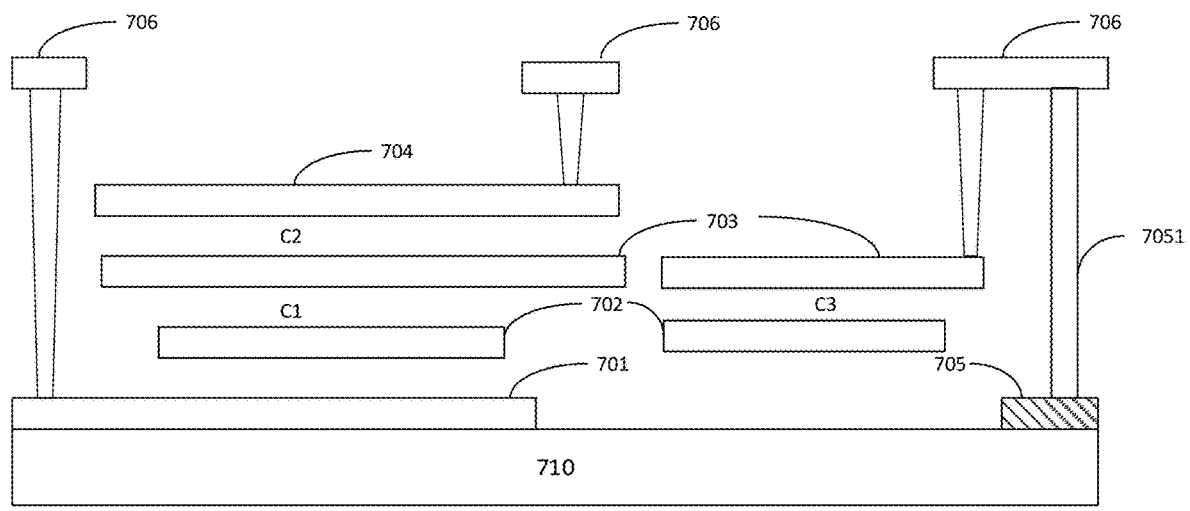
FIG. 7L is a schematic diagram of exemplary stacked layers of the pixel circuit shown in FIG. 7K.

FIG. 7K illustrates another exemplary partial layout of the pixel circuit shown in FIG. 6 provided by an embodiment of the present disclosure. FIG. 7L is a schematic diagram of exemplary stacked layers of the pixel circuit shown in FIG. 7K. The schematic diagram of stacked layers shown in FIG. 7L is depicted by taking, e.g., the third transistor T3 for example. That is, the first active layer 701 and the first conductive layer 702 shown in the figure correspond to the active layer and the gate of the transistor, respectively. In FIG. 7K and FIG. 7L, other portions than the structure for forming the third capacitor C3 are the same with FIG. 7A to FIG. 7F, which will not be described here redundantly.

As shown in FIG. 7K and FIG. 7L, the conductor portion 705 electrically connected to the drain of the third transistor directly, the first conductive layer 702 and the second conductive layer 703 form the third capacitor C3. A portion (e.g., the portion forming the first electrode of the second capacitor C2) of the second conductive layer 703 is electrically connected to the conductor portion 705 through the via hole 7051 and the connection electrode in the first source-drain metal layer 706, and this portion serves as a first capacitor electrode of the third capacitor C3. The portion of the first conductive layer for forming the gate of the fifth transistor T5 serves as a second capacitor electrode of the third capacitor C3 (there is no the above-mentioned extension portion 7021 in this embodiment). The first capacitor electrode and the second capacitor electrode of the third capacitor C3 overlap each other in the direction perpendicular to the base substrate 710, thereby forming the third capacitor C3.

Figure 7M:
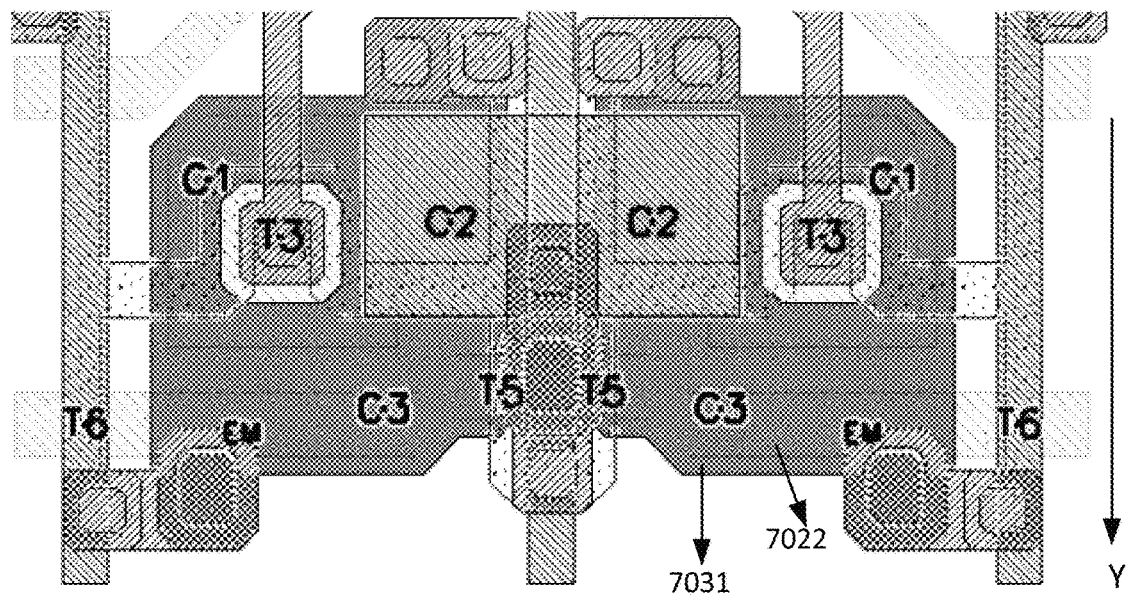
FIG. 7M illustrates another exemplary partial layout of the pixel circuit shown in FIG. 6 provided by an embodiment of the present disclosure.
Figure 7N:
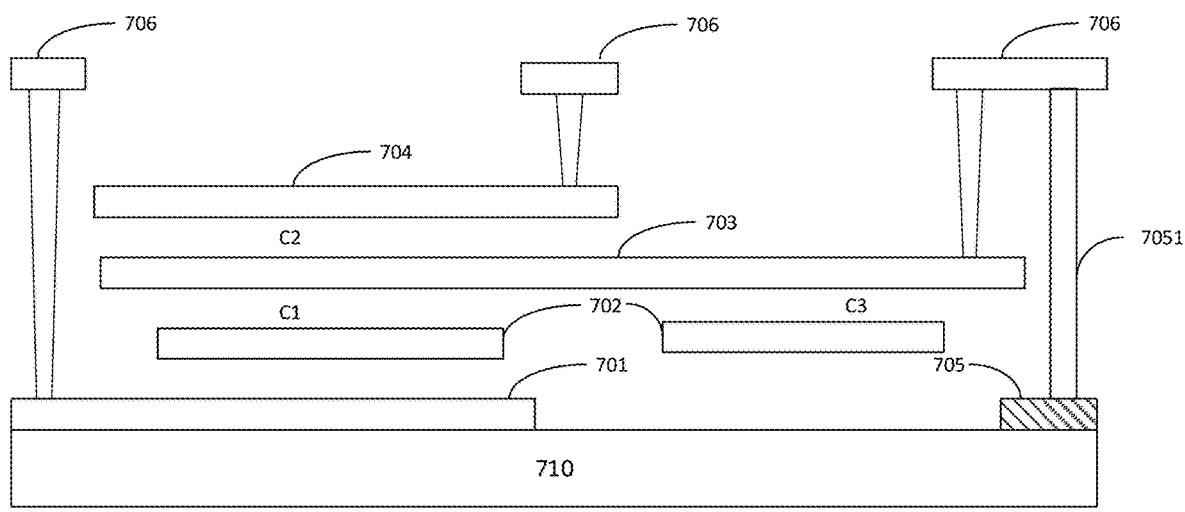
FIG. 7N illustrates an exemplary stacking structure of the pixel circuit shown in FIG. 7M.

FIG. 7M illustrates another exemplary partial layout of the pixel circuit shown in FIG. 6 provided by an embodiment of the present disclosure. FIG. 7N illustrates an exemplary stacking structure of the pixel circuit shown in FIG. 7M. The schematic diagram of stacked layers shown in FIG. 7N is depicted by taking, e.g., the third transistor T3 for example. That is, the first active layer 701 and the first conductive layer 702 shown in the figure correspond to the active layer and the gate of the transistor, respectively. In FIG. 7M and FIG. 7N, other portions than the structure for forming the third capacitor C3 are the same with FIG. 7A to FIG. 7F, which will not be described here redundantly.

Compared with FIG. 7A and FIG. 7M, for example, the second conductive layer 703 may be widened in a Y direction to obtain a protrusion portion 7031 in the Y direction of the second conductive layer. As shown in FIG. 7M and FIG. 7N, the protrusion portion 7031 of the second conductive layer 703 may serve as the first capacitor electrode of the third capacitor C3, and the portion 7022 of the first conductive layer 702 for forming the first light emitting control signal line EM may serve as the second capacitor electrode of the third capacitor C3.

It needs to be noted that all the transistors used in the embodiments of the present disclosure may be thin-film transistors or field effect transistors or other switching devices having the same characteristics. The thin-film transistor is described as an example in the embodiments of the present disclosure. The source and the drain of a transistor used herein may be structurally symmetrical and thus may be structurally indistinguishable. In an embodiment of the present disclosure, to distinguish between other two electrodes than the gate of the transistor, one electrode is directly described as the first electrode, while the other electrode as the second electrode.

At least one embodiment of the present disclosure further provides an array substrate including a plurality of pixel units arranged in an array, where each of the pixel units includes the pixel circuit provided by any embodiment of the present disclosure.

Figure 8:
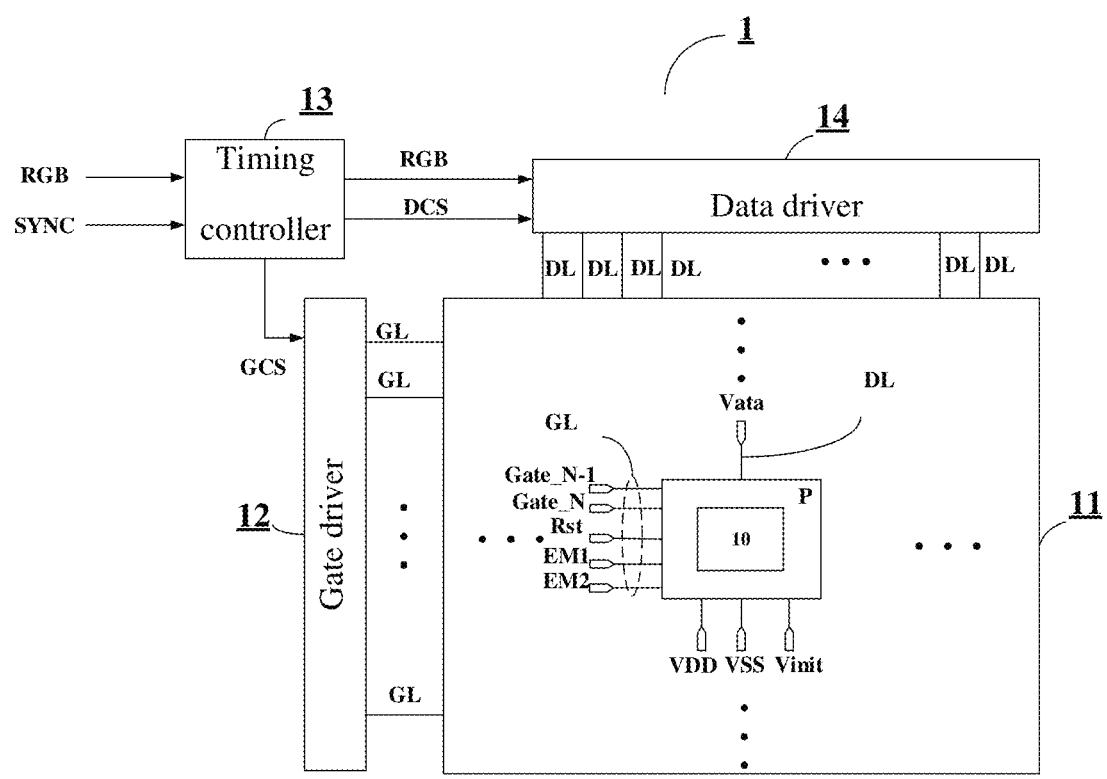
FIG. 8 is a schematic diagram of an array substrate and a display device provided by an embodiment of the present disclosure.

FIG. 8 is a schematic block diagram of an array substrate provided by an embodiment of the present disclosure. As shown in FIG. 8, the array substrate 11 is disposed in a display device 1 and electrically connected to a gate driver 12, a timing controller 13 and a data driver 14. The array substrate 11 includes a pixel unit P defined by a plurality of scan lines GL and a plurality of data lines DL crosswise. The gate driver 12 is configured to drive the plurality of scan lines GL. The data driver 14 is configured to drive the plurality of data lines DL. The timing controller 13 is configured to process external image data RGB input to the display device 1, provide processed image data RGB to the data driver 14, and output a scanning control signal GCS and a data control signal DCS to the gate driver 12 and the data driver 14 to control the gate driver 12 and the data driver 14.

For example, the array substrate 11 includes a plurality of pixel units P, each pixel unit P including any pixel circuit 10 provided in the above embodiments; for example, the pixel circuit 20 shown in FIG. 6 is included. As shown in FIG. 8, the array substrate 11 further includes a plurality of scan lines GL and a plurality of data lines DL. For example, the plurality of scan lines are correspondingly connected to the data writing circuits 200 in the pixel circuits 10 of each row of pixel units to provide the first scanning signal.

For example, the pixel units P are disposed in crossing regions of the scan lines GL and the data lines DL. For example, as shown in FIG. 8, each pixel unit P is connected to five scan lines GL (which provide the first scanning signal Gate_N, the first reset control signal Re_N, the second reset control signal Re_P, the first light emitting control signal EM1 and the second light emitting control signal EM2, respectively), one data line DL, a first voltage line for providing the first power voltage VDD, a second voltage line for providing the second voltage VSS, a voltage line for providing the first initialization voltage Vinit1 and a voltage line for providing the second initialization voltage Vinit2. It needs to be noted that, only partial pixel units P, scan lines GL and data lines DL are illustrated in FIG. 8.

For example, the plurality of pixel units P are arranged in a plurality of rows. The first initialization circuits 500 of the pixel circuits of each row of pixel units P are connected to a same scan line GL, and the second initialization circuits 600 of the pixel circuits of each row of pixel units P connected to another scan line GL and the data writing circuits 200 of the pixel circuits of each row of pixel units P connected to another scan line GL to receive the first scanning signal. For example, each column of data lines DL is connected to the data writing circuits 200 in the pixel circuits 10 of this column to provide a data signal.

For example, the plurality of pixel units are arranged in a plurality of rows. The first light emitting control circuits 300 of the pixel circuits of the nth (n is an integer greater than 1) row of pixel units are connected to a same light emitting control line, and the second light emitting control circuits 400 of the pixel circuits of the nth row of pixel units are connected to another light emitting control line.

For example, the gate driver 12 provides a plurality of gating signals to the plurality of scan lines GL according to a plurality of scanning control signals GCS originating from the timing controller 13. The plurality of gating signals include a first scanning signal, a second scanning signal, a first light emitting control signal, a second light emitting control signal and a reset signal (i.e., the second scanning signal). These signals are provided to each pixel unit P through the plurality of scan lines GL.

For example, the data driver 14 transforms digital image data RGB input from the timing controller 13 into a data signal by using a reference gamma voltage according to a plurality of data control signals DCS originating from the timing controller 13. The data driver 14 provides the transformed data signal to the plurality of data lines DL.

For example, the timing controller 13 processes external input image data RGB to match the size and the resolution of the array substrate 11, and then provides processed image data to the data driver 14. The timing controller 13 generates a plurality of scanning control signals GCS and a plurality of data control signals DCS using an external synchronization signal (such as a dot clock DCLK, a data enable signal DE, a horizontal synchronization signal Hsync and a vertical synchronization signal Vsync) input to the display device. The timing controller 13 provides the generated scanning control signals GCS and data control signals DCS to the gate driver 12 and the data driver 14, respectively, to control the gate driver 12 and the data driver 14.

For example, the data driver 14 may be connected to a plurality of data lines DL to provide the data signal Vdata, and may also be connected to a plurality of first voltage lines, a plurality of second voltage lines and a plurality of reset voltage lines to provide the first voltage, the second voltage and the reset voltage, respectively.

For example, the gate driver 12 and the data driver 14 may be implemented as semiconductor chips. The display device 1 may also include other components, such as a signal decoding circuit and a voltage conversion circuit. These components may be, e.g., existing conventional components, which will not be described in detail here.

For example, the array substrate 11 provided in this embodiment may be applied to any product or component with a display function, such as electronic paper, a mobile phone, a tablet computer, a TV, a display, a laptop, a digital photo frame and a navigator.

The technical effects of the array substrate 11 may be known with reference to the technical effects of the pixel circuit 10 provided in the embodiments of the present disclosure, which will not be described here redundantly.

For the present disclosure, there are still some points that are needed to be noted:

(1) the accompanying drawings in the embodiments of the present disclosure only involve structures involved in the embodiments of the present disclosure, and other structures may be designed as usual;

(2) for the sake of clarity, the thickness of a layer or a region in the accompanying drawings for describing the embodiments of the present disclosure is scaled up or down. In other words, the drawings are not drawn to actual scale. It will be understood that when a component such as a layer, a film, a region or a substrate is referred to as being located "on" or "below" another component, the component may be "directly" located "on" or "below" another component, or there may be an intermediate component; and (3) the embodiments of the present disclosure and the features in the embodiments can be combined with one another to derive new embodiments without conflict.

The foregoing are merely descriptions of specific embodiments of the present disclosure, but the protection scope of the present disclosure is not limited thereto. The protection scope of the present disclosure is subject to the protection scope of the claims.

What is claimed is:

1. A pixel circuit, comprising a driving circuit, a data writing circuit, a first light emitting control circuit, a second light emitting control circuit, a first initialization circuit, a second initialization circuit and an energy storage circuit, wherein
    the driving circuit comprises a control terminal, a first terminal and a second terminal and is configured to control a driving current which flows through the first terminal and the second terminal for driving a light emitting element to emit light;
    the data writing circuit is configured to write a data signal into the control terminal of the driving circuit under control of a first scanning signal;
    the first light emitting control circuit is configured to apply a first power voltage from a first power terminal to the first terminal of the driving circuit under control of a first light emitting control signal;
    the second light emitting control circuit is configured to apply the driving current from the second terminal of the driving circuit to the light emitting element under control of a second light emitting control signal;
    the first initialization circuit is configured to apply a first initialization voltage to the control terminal of the driving circuit under control of a first reset control signal;
    the second initialization circuit is configured to apply a second initialization voltage to the second terminal of the driving circuit under control of a second reset control signal;
    the energy storage circuit is configured to store the data signal written in the control terminal of the driving circuit;
    wherein the first initialization circuit comprises a first transistor, the data writing circuit comprises a second transistor and the driving circuit comprises a third transistor;
    a leakage current characteristic of a semiconductor material of a first active layer of the first transistor is less than a leakage current characteristic of a semiconductor material of a third active layer of the third transistor; and a leakage current characteristic of a semiconductor material of a second active layer of the second transistor is less than the leakage current characteristic of the semiconductor material of the third active layer of the third transistor.

2. The pixel circuit according to claim 1, wherein the semiconductor material of the first active layer of the first transistor is same as the semiconductor material of the second active layer of the second transistor.

3. The pixel circuit according to claim 2, wherein the semiconductor material of the first active layer of the first transistor is an oxide semiconductor; and
    the third active layer of the third transistor is made of a polycrystalline silicon semiconductor material.

4. The pixel circuit according to claim 3, wherein the oxide semiconductor is an indium oxide semiconductor material; and
    the polycrystalline silicon semiconductor material is a low-temperature polycrystalline silicon semiconductor material.

5. The pixel circuit according to claim 2, wherein active layers of respective transistors comprised in the first light emitting control circuit, the second light emitting control circuit and the second initialization circuit are made of a same semiconductor material and in a same layer as the third active layer of the third transistor.

6. The pixel circuit according to claim 1, wherein the energy storage circuit comprises a first capacitor and a second capacitor;
    the first capacitor is electrically connected between the control terminal of the driving circuit and the first terminal of the driving circuit; the second capacitor is electrically connected between the first terminal of the driving circuit and the first power terminal; and an electrode, electrically connected to the first terminal of the driving circuit, of the first capacitor is electrically connected to an electrode, electrically connected to the first terminal of the driving circuit, of the second capacitor.

7. The pixel circuit according to claim 6, further comprising a reset circuit, wherein the reset circuit is configured to couple a change of the first light emitting control signal to the first terminal of the driving circuit.

8. The pixel circuit according to claim 7, wherein the reset circuit comprises a third capacitor which is electrically connected between a control terminal of the first light emitting control circuit and the first terminal of the driving circuit.

9. The pixel circuit according to claim 8, wherein the third capacitor comprises a first capacitor electrode and a second capacitor electrode which are opposite to each other and located in different layers,
    wherein the first capacitor electrode and the third active layer of the third transistor are in an integral structure; and
    the second capacitor electrode and the control terminal of the first light emitting control circuit are in an integral structure.

10. The pixel circuit according to claim 9, wherein the third capacitor further comprises a third capacitor electrode, and the third capacitor electrode and the first capacitor are respectively at two sides of the second capacitor electrode in a direction perpendicular to a base substrate and are electrically connected to each other.

11. The pixel circuit according to claim 8, wherein a capacitance value of the third capacitor is one tenth, one hundredth or less of a capacitance value of the second capacitor.

12. The pixel circuit according to claim 1, wherein the first initialization voltage and the second initialization voltage are different from each other.

13. The pixel circuit according to claim 1, wherein the first light emitting control signal and the second light emitting control signal are identical.

14. An array substrate, comprising a plurality of pixel units arranged in an array, wherein each of the plurality of pixel units comprises the pixel circuit according to claim 1.

15. A display device, comprising the array substrate according to claim 14.

16. A driving method of a pixel circuit, the pixel circuit comprising a driving circuit, a data writing circuit, a first light emitting control circuit, a second light emitting control circuit, a first initialization circuit, a second initialization circuit and an energy storage circuit, wherein the driving circuit comprises a control terminal, a first terminal and a second terminal and is configured to control a driving current which flows through the first terminal and the second terminal for driving a light emitting element to emit light;

the data writing circuit is configured to write a data signal into the control terminal of the driving circuit under control of a first scanning signal;

the first light emitting control circuit is configured to apply a first power voltage from a first power terminal to the first terminal of the driving circuit under control of a first light emitting control signal;

the second light emitting control circuit is configured to apply the driving current from the second terminal of the driving circuit to the light emitting element under control of a second light emitting control signal;

the first initialization circuit is configured to apply a first initialization voltage to the control terminal of the driving circuit under control of a first reset control signal;

the second initialization circuit is configured to apply a second initialization voltage to the second terminal of the driving circuit under control of a second reset control signal;

the energy storage circuit is configured to store the data signal written in the control terminal of the driving circuit;

wherein the first initialization circuit comprises a first transistor, the data writing circuit comprises a second transistor and the driving circuit comprises a third transistor;

a leakage current characteristic of a semiconductor material of a first active layer of the first transistor is less than a leakage current characteristic of a semiconductor material of a third active layer of the third transistor; and a leakage current characteristic of a semiconductor material of a second active layer of the second transistor is less than the leakage current characteristic of the semiconductor material of the third active layer of the third transistor, the driving method comprises a first operating time period which comprises a reset phase, a sampling phase, a writing phase and a light emitting phase, wherein at the reset phase, the first initialization circuit is switched on under the control of the first reset control signal, applying the first initialization voltage to the control terminal of the driving circuit, and the second initialization circuit is switched on under the control of the second reset control signal, applying the second initialization voltage to the second terminal of the driving circuit;

at the sampling phase, the first light emitting control circuit and the second light emitting control circuit are switched off, and the first initialization circuit is maintained on under the control of the first reset control signal, applying the first initialization voltage to the control terminal of the driving circuit; and the second initialization circuit is maintained on under the control of the second reset control signal, applying the second initialization voltage to the second terminal of the driving circuit;

at the writing phase, the first initialization circuit, the second initialization circuit, the first light emitting control circuit and the second light emitting control circuit are switched off, the data writing circuit is caused to write the received data signal into the control terminal of the driving circuit under the control of the first scanning signal, and the data signal is stored in the energy storage circuit through the energy storage circuit; and at the light emitting phase, the first initialization circuit and the second initialization circuit are switched off, and the first light emitting control circuit is switched on under the control of the first light emitting control signal, applying the first power voltage of the first power terminal to the first terminal of the driving circuit, and the second light emitting control circuit is switched on under the control of the second light emitting control signal, applying the driving current from the second terminal of the driving circuit to the light emitting element to drive the light emitting element.

17. The driving method according to claim 16, further comprising a second operating time period immediately following the first operating time period in time, wherein the first light emitting control signal, the second light emitting control signal and the second reset control signal have a first frequency, the first reset control signal and the first scanning signal have a second frequency, and the first frequency is greater than the second frequency; and in the second operating time period, the first light emitting control signal, the second light emitting control signal and the second reset control signal enter a different cycle, and the first reset control signal and the first scanning signal are still in a same cycle, compared with the first operating time period.

18. The driving method according to claim 17, wherein the first frequency is greater than 30 Hz, and the second frequency is 1 Hz to 10 Hz.

19. The driving method according to claim 16, wherein at the reset phase, the first light emitting control circuit is further switched on under the control of the first light emitting control signal, applying the first power voltage of the first power terminal to the first terminal of the driving circuit, and the second light emitting control circuit is further switched on under the control of the second light emitting control signal, applying the second initialization voltage from the second initialization circuit to the light emitting element.

20. The driving method according to claim 19, wherein in a case where the second initialization circuit applies the second initialization voltage to the light emitting element, the second initialization voltage prevents the light emitting element from being switched on.

\* \* \* \* \*